United States Patent
Oyagi et al.

(10) Patent No.: US 11,411,381 B2
(45) Date of Patent: *Aug. 9, 2022

(54) WIRE AND MOLD-MEMBER ASSEMBLY AND CABLE WITH CONNECTOR

(71) Applicant: SUMITOMO ELECTRIC INDUSTRIES, LTD., Osaka (JP)

(72) Inventors: Masaki Oyagi, Tochigi (JP); Wataru Sakurai, Tochigi (JP); Keiichiro Fukuda, Tochigi (JP); Sainer Siagian, Tochigi (JP); Toru Nakanishi, Tochigi (JP); Takayoshi Koinuma, Tochigi (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 27 days.

This patent is subject to a terminal disclaimer.

(21) Appl. No.: 16/769,809

(22) PCT Filed: May 10, 2019

(86) PCT No.: PCT/JP2019/018817
§ 371 (c)(1),
(2) Date: Jun. 4, 2020

(87) PCT Pub. No.: WO2020/230210
PCT Pub. Date: Nov. 19, 2020

(65) Prior Publication Data
US 2021/0296878 A1    Sep. 23, 2021

(51) Int. Cl.
*H02G 15/04* (2006.01)
*H01B 11/00* (2006.01)
(Continued)

(52) U.S. Cl.
CPC .......... *H02G 15/043* (2013.01); *H01B 11/00* (2013.01); *H01R 12/53* (2013.01); *H01R 12/57* (2013.01);
(Continued)

(58) Field of Classification Search
CPC .................................................... H02G 15/043
(Continued)

(56) References Cited

U.S. PATENT DOCUMENTS 6,183,302 B1   2/2001   Daikuhara et al.
6,764,342 B2   7/2004   Murayama et al.
(Continued)

FOREIGN PATENT DOCUMENTS

CN    107484332         12/2017
JP    2000-187452 A  *  12/1998
(Continued)

OTHER PUBLICATIONS

Office Action dated Jul. 28, 2021 with respect to the U.S. Appl. No. 16/943,106.
(Continued)

*Primary Examiner* — Stanley Tso
(74) *Attorney, Agent, or Firm* — IPUSA, PLLC

(57) ABSTRACT

A wire and mold-member assembly (11, 12, 13) includes a plurality of differential transmission wires (20a to 20f) and a mold member (160, 260) situated at an end of the plurality of differential transmission wires and configured to bundle the plurality of differential transmission wires together. The mold member has a first face (160A, 260A) and a second face (160B, 260B) each intersecting with the plurality of differential transmission wires, and the second face is inclined at an angle greater than 0 degrees and less than 90 degrees relative to the first face.

17 Claims, 18 Drawing Sheets

(51) Int. Cl.
  *H01R 12/53* (2011.01)
  *H01R 12/57* (2011.01)
  *H05K 1/11* (2006.01)

(52) U.S. Cl.
  CPC ... *H05K 1/117* (2013.01); *H05K 2201/09027* (2013.01)

(58) Field of Classification Search
  USPC .......................................................... 174/261
  See application file for complete search history.

(56) References Cited

U.S. PATENT DOCUMENTS

| | | | |
|---|---|---|---|
| 7,004,783 | B2 | 2/2006 | Kumamoto et al. |
| 7,594,826 | B2 | 9/2009 | Kobayashi et al. |
| 2002/0002004 | A1 | 1/2002 | Akama et al. |
| 2009/0277665 | A1 | 11/2009 | Kumamoto et al. |
| 2009/0305551 | A1* | 12/2009 | Kameda ............. H01R 13/6471 439/497 |
| 2011/0143579 | A1* | 6/2011 | Karabatsos .......... H01R 12/721 439/485 |
| 2011/0294356 | A1 | 12/2011 | Mizukami et al. |
| 2012/0178292 | A1 | 7/2012 | Kumamoto et al. |
| 2015/0162706 | A1 | 6/2015 | Kennedy et al. |
| 2020/0359497 | A1* | 11/2020 | Fukuda ............. H01R 13/6658 |

FOREIGN PATENT DOCUMENTS

| | | | |
|---|---|---|---|
| JP | 2000-068006 | | 3/2000 |
| JP | 2000-068007 | | 3/2000 |
| JP | 2000-123893 | | 4/2000 |
| JP | 2004-031257 | | 1/2004 |
| JP | 2004-253272 | | 9/2004 |
| JP | 2009-042777 | | 2/2009 |
| JP | 2009-182294 | | 8/2009 |
| JP | 2009-205972 | | 9/2009 |
| JP | 2009-272247 | | 11/2009 |
| JP | 2010-108672 | | 5/2010 |
| JP | 2010113813 | * | 5/2010 |
| JP | 2010-130274 | | 6/2010 |
| JP | 2012-142245 | | 7/2012 |
| JP | 2017-503313 | | 1/2017 |

OTHER PUBLICATIONS

Office Action dated Nov. 5, 2021 with respect to the U.S. Appl. No. 16/943,106.

\* cited by examiner

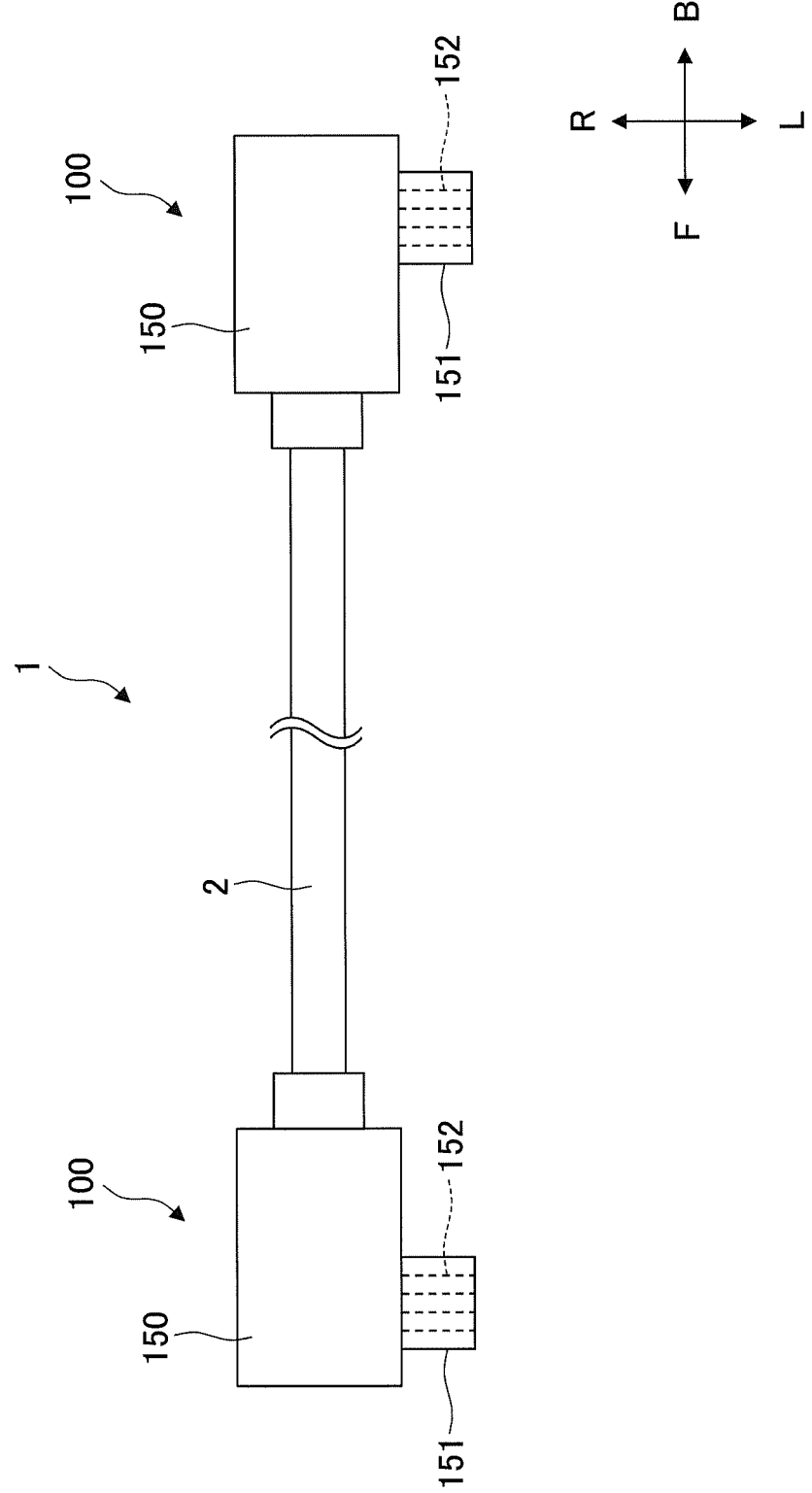

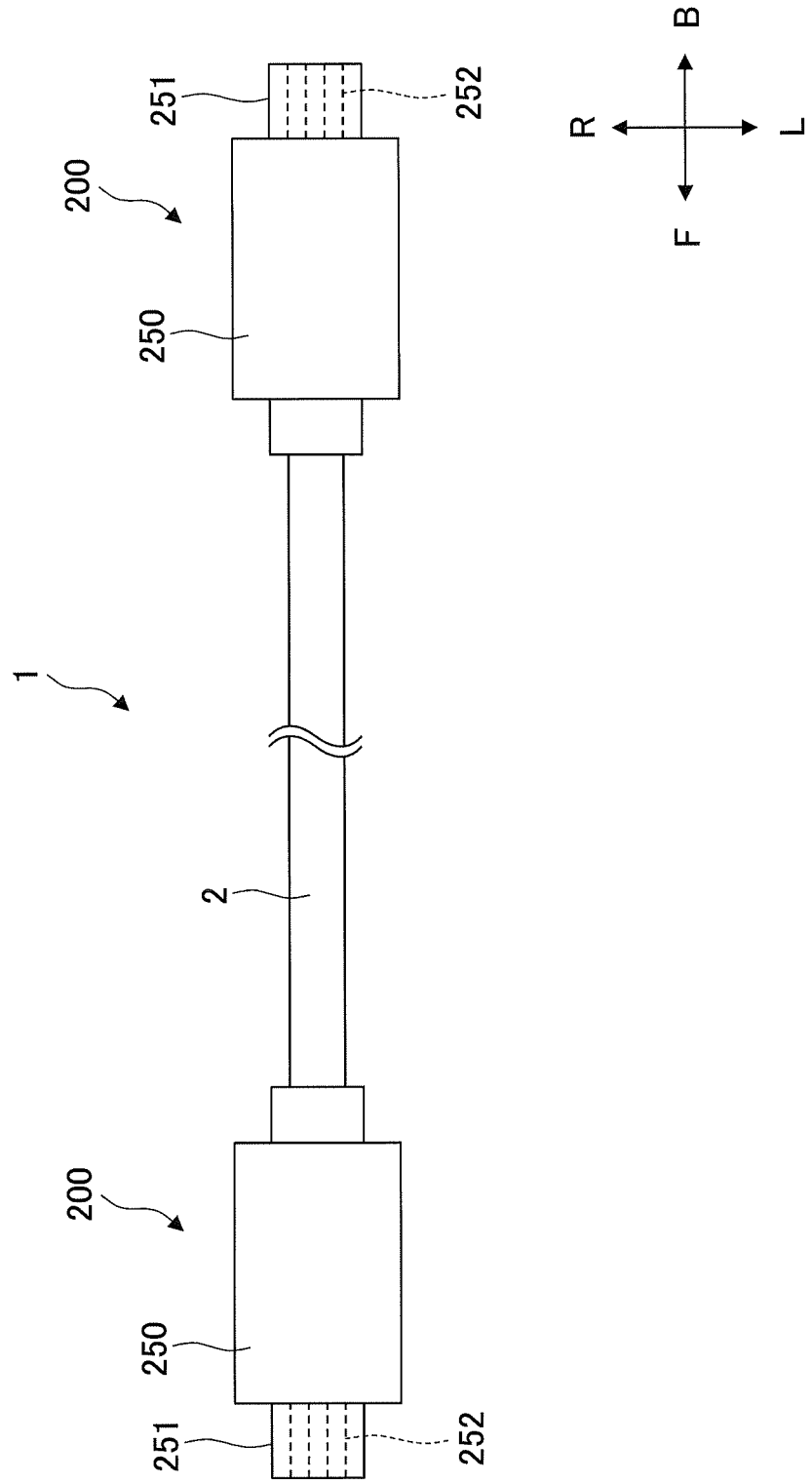

WIRE AND MOLD-MEMBER ASSEMBLY AND CABLE WITH CONNECTOR

TECHNICAL FIELD

The disclosures herein relate to a wire and mold-member assembly and a cable with a connector.

BACKGROUND ART

Patent Documents 1 to 3 disclose a connector with a cable and with a relay board. The relay board is provided with pads (i.e., wire pads) on which a plurality of electric wires of the cable are soldered and pads (i.e., connector pads) for connection with connector pins. Both the wire pads and the connector pads are arranged side by side in the direction perpendicular to the longitudinal direction of the cable, and connections between the wire pads and the connector pads extend in a straight line.

Patent Document 4 discloses a right-angle socket connector for connecting a cable to a printed circuit board in an electronic device (e.g., communication device).

RELATED-ART DOCUMENTS

Patent Document

[Patent Document 1] Japanese Patent Application Publication No. 2000-68007
[Patent Document 2] Japanese Patent Application Publication No. 2004-31257
[Patent Document 3] Japanese Patent Application Publication No. 2004-253272
[Patent Document 4] Japanese Patent Application Publication No. 2009-205972

SUMMARY OF THE INVENTION

A wire and mold-member assembly includes a plurality of differential transmission wires and a mold member situated at an end of the plurality of differential transmission wires and configured to bundle the plurality of differential transmission wires together, wherein the mold member has a first face and a second face each intersecting with the plurality of differential transmission wires, and the second face is inclined at an angle greater than 0 degrees and less than 90 degrees relative to the first face.

BRIEF DESCRIPTION OF DRAWINGS

FIG. 14A is a drawing illustrating an example of the configuration of a cable with connectors.
FIG. 14B is a drawing illustrating another example of the configuration of a cable with connectors.

MODE FOR CARRYING OUT THE INVENTION

Figure 1:
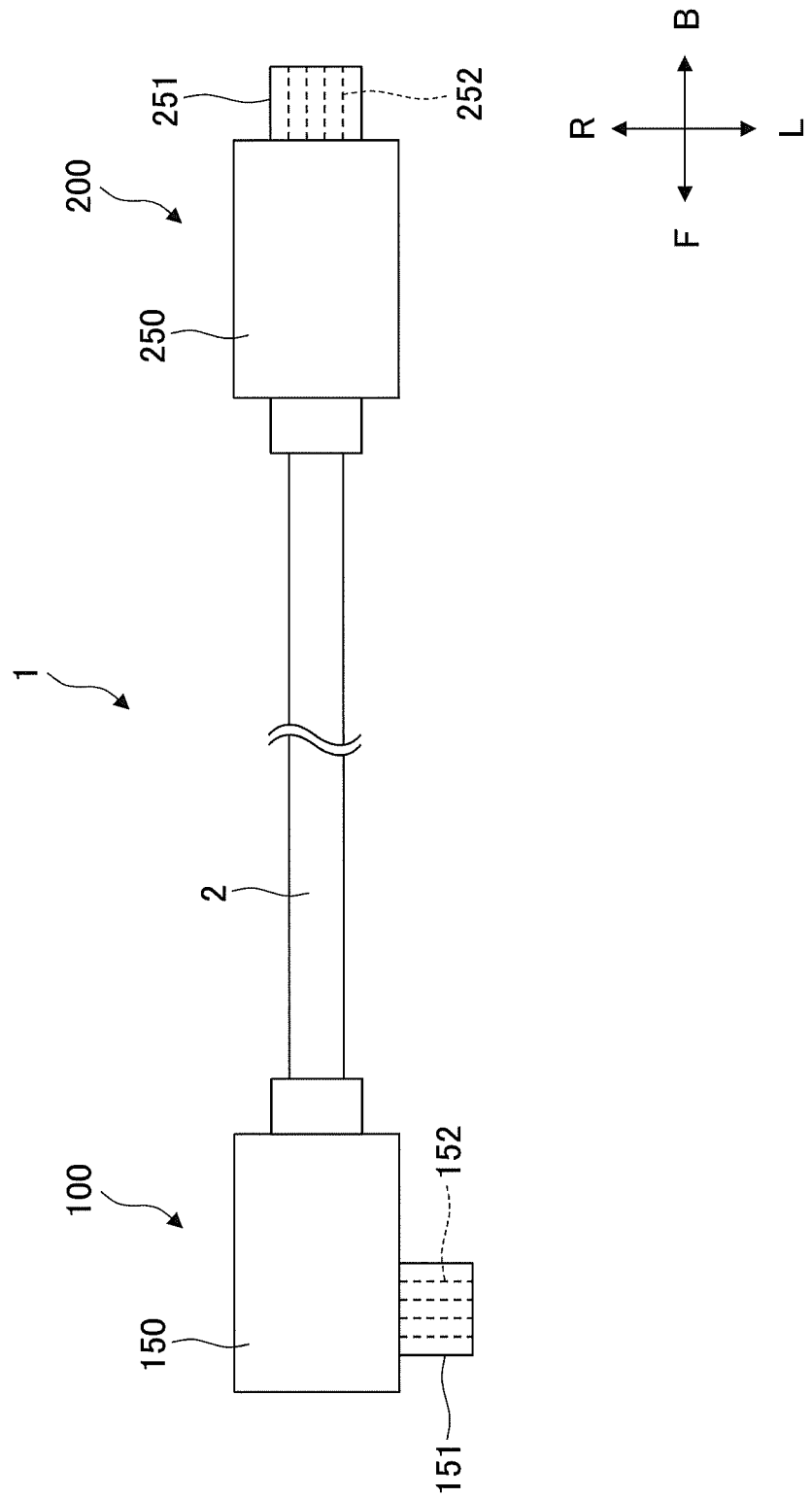
FIG. 1 is a schematic diagram illustrating an appearance of a cable with connectors according to a first embodiment.

Embodiments will be described in the following.
[Description of Embodiments of the Present Disclosures]
Embodiments of the present disclosures will be listed and described first. In the following description, the same or corresponding elements are referred to by the same reference numerals, and a duplicate description thereof will be omitted.

[1] A wire and mold-member assembly according to an embodiment of the present disclosures includes a plurality of differential transmission wires and a mold member situated at an end of the plurality of differential transmission wires and configured to bundle the plurality of differential transmission wires together, wherein the mold member has a first face and a second face each intersecting with the plurality of differential transmission wires, and the second face is inclined at an angle greater than 0 degrees and less than 90 degrees relative to the first face.

The mold member bundles the plurality of differential transmission wires together. Further, the second face of the mold member is inclined at an angle greater than 0 degrees and less than 90 degrees relative to the first face, so that differences in line length between the plurality of differential transmission wires can be reduced compared to the case in which the plurality of differential transmission wires are bent at a right angle. Accordingly, it is possible to reduce the area for reducing differences in line length in the relay board to which the plurality of differential transmission wires are connected.

[2] A cable outer sheath covering the plurality of differential transmission wires and insulated wires covered with the outer sheath are provided, and the insulated wires intersect with the second face of the mold member. Disarray of the insulated wires may be reduced

[3] A portion of each of the insulated wires closer to a tip thereof than a portion intersecting with the second face intersects with a third face different from the second face. As a result, the positions of the insulated wires are readily adjustable when joining the insulated wires to the pads of the relay board.

[4] A cable outer sheath covering the plurality of differential transmission wires and insulated wires covered with the outer sheath are provided, and the insulated wires are disposed outside the mold member. As a result, the positions of the insulated wires are more readily adjustable when joining the insulated wires to the pads of the relay board.

[5] The second face is inclined at an angle greater than or equal to 30 degrees and less than or equal to 60 degrees relative to the first face. As a result, differences in line length between the plurality of differential transmission wires are readily adjustable.

[6] The plurality of differential transmission wires are arranged in a single row or in two rows inside the mold member. As a result, the plurality of differential transmission wires are aligned in such a fashion as to be readily connected to the relay board in accordance with the configuration of the relay board to which the plurality of differential transmission wires are connected.

[7] A relay board disposed at the end of the plurality of differential transmission wires is provided. The relay board includes a plurality of first pads aligned in a first direction and connected to the plurality of differential transmission wires, a plurality of second pads aligned in a second direction, and lines connecting the plurality of first pads and the plurality of second pads, respectively, wherein the second direction is inclined at an angle greater than 0 degrees and less than 90 degrees relative to the first direction. As a result, the relationship between the longitudinal direction of the plurality of differential transmission wires and the second direction in which the second pads of the relay board are aligned is adjustable as desired.

[8] The second direction is inclined at an angle greater than or equal to 30 degrees and less than or equal to 60 degrees relative to the first direction. As a result, the relationship between the longitudinal direction of the plurality of differential transmission wires and the second direction in which the second pads of the relay board are aligned are readily adjusted to be suitable for a right-angle connector or a straight connector.

[9] An electronic component is mounted on the relay board. As a result, space on the relay board is effectively utilized.

[10] A wire and mold-member assembly according to another embodiment of the present disclosures includes a plurality of differential transmission wires, a mold member situated at an end of the plurality of differential transmission wires and configured to bundle the plurality of differential transmission wires together, and a relay board disposed at the end, wherein the mold member has a first face and a second face each intersecting with the plurality of differential transmission wires, wherein the first face is situated closer to a tip of the end than the second face, wherein the second face is inclined at an angle greater than or equal to 30 degrees and less than or equal to 60 degrees relative to the first face, and wherein the relay board includes a plurality of first pads aligned in a first direction parallel to the first face and connected to the plurality of differential transmission wires, a plurality of second pads aligned in a second direction perpendicular to the second face, and lines connecting the plurality of first pads and the plurality of second pads, respectively.

[11] A cable with a connector according to another embodiment of the present disclosures includes the wire and mold-member assembly with the relay board, a housing accommodating the relay board, and a plurality of connector terminals disposed inside the housing and aligned in the second direction.

[12] The cable with a connector according to such another embodiment of the present disclosures is such that the relay board includes a re-driver IC chip for signal correction and a component for temperature rise prevention, and the component for temperature rise prevention is connected to the re-driver IC chip for signal correction between the first pads and the second pads.

[Details of Embodiments of the Present Disclosures]

In the following, embodiments of the present disclosures will be described in detail, but the present embodiments are not limited to those disclosed herein. In the specification and drawings, elements having substantially the same functions or configurations are referred to by the same numerals, and a duplicate description thereof may be omitted. U, D, F, B, R, and L illustrated in the drawings refer to directions relative to a cable. U denotes an upper direction, D denoting a lower direction, F denoting a front direction, B denoting a back direction, R denoting a right direction, and L denoting a left direction.

First Embodiment

A first embodiment will be described first. FIG. 1 is a schematic diagram illustrating an appearance of a cable with connectors according to a first embodiment.

As illustrated in FIG. 1, a cable 1 with connectors according to the first embodiment includes a cable 2, a connector 100 connected to one end of the cable 2, and a connector 200 connected to the other end of the cable 2.

The cable 2 is a multicore cable having a plurality of electric wires covered with a cable outer sheath, for example. The connector 100 is a right-angle connector having a connection part 151 projecting laterally on the opposite side to where the cable 2 is connected. The connector 200 is a straight connector having a connection part 251 projecting in the longitudinal direction of the cable 2 on the opposite side to where the cable 2 is connected.

The cable 1 may be used as a cable for connecting factory automation (FA) devices, for example. The cable 1 may be used as a cable for connecting an electronic device, a mobile terminal, or the like with another device, for example.

Figure 2:
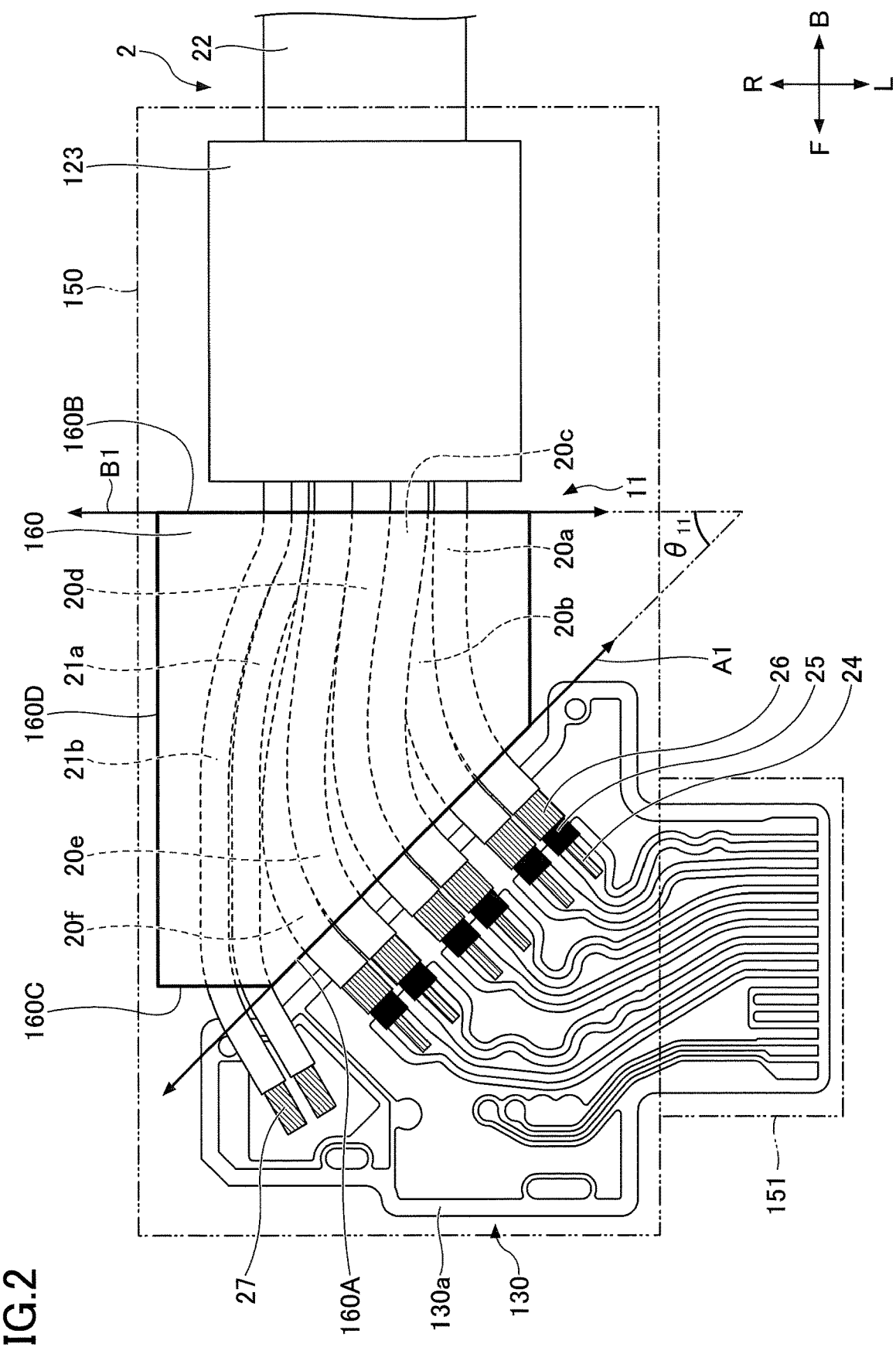
FIG. 2 is a drawing (1) illustrating the internal structure of a connector of the first embodiment.

In the following, the internal structure of the connector 100 will be described. FIG. 2 is a drawing illustrating the internal structure of the connector 100 of the first embodiment. FIG. 2 illustrates how the inside of the connector 100 appears when viewed from above (i.e., from the U side).

As illustrated in FIG. 2, the cable 2 includes a plurality (six in this example) of coaxial wires 20a to 20f, a plurality (two in this example) of insulated wires 21a and 21b for supplying power, and a cable outer sheath 22 covering these electric wires. As an example, the coaxial wire 20a and the coaxial wire 20b are used as a pair of differential transmission lines, and the coaxial wire 20c and the coaxial wire 20d are used as a pair of differential transmission lines, with the coaxial wire 20e and the coaxial wire 20f being used as a pair of differential transmission lines. Coaxial cables 28 AWG (American Wire Gauge) to 40 AWG, for example, may be used as the coaxial wires 20a to 20f. The coaxial wires 20a to 20f and the insulated wires 21a and 21b are exposed beyond the cable outer sheath 22 at the front (i.e., F-side) end of the cable 2, and are bundled by a bundling unit 123, for example. The coaxial wires 20a to 20f exposed beyond the cable outer sheath 22 are such that respective predetermined lengths (i.e., lengths set in advance) of a center conductor 24, an insulator 25, and an outer conductor 26 are exposed in a step-wise manner. Further, the insulated wires 21a and 21b exposed beyond the cable outer sheath 22 are configured such that an insulation at the tip is removed to expose a conductor 27. The coaxial wires 20a to 20f are examples of the differential transmission wires.

The connector 100 includes a housing 150 in which the bundling unit 123 and the front (i.e., F-side) portions of the coaxial wires 20a to 20f and the insulated wires 21a and 21b extending beyond the bundling unit 123 are stored in the housing 150. The bundling unit 123 also has the function to secure the cable 2 to the housing 150. The housing 150 also stores a relay board 130 connected to the coaxial wires 20a to 20f and to the insulated wires 21a and 21b. A connection part 151 forms part of the housing 150. A plurality of connector terminals 152 are provided inside the connection part 151 (see FIG. 1). The cable 2 and the connector terminals 152 are connected to the relay board 130 inside the housing 150.

The connector 100 includes a mold member 160 which bundles the front (i.e., F side) portions of the coaxial wires 20a to 20f and the insulated wires 21a and 21b extending beyond the bundling unit 123. The mold member 160 organizes the arrangement of the front (i.e., F side) portions of the coaxial wires 20a to 20f and the insulated wires 21a and 21b extending beyond the bundling unit 123. The exposed portions of the center conductor 24, the insulator 25, and the outer conductor 26 of the coaxial wires 20a to 20f and the portion of the conductor 27 of the insulated wires 21a and 21b which is exposed upon removing the insulation are exposed beyond the mold member 160. The mold member is made of a resin such as polyamide resin, for example.

The mold member 160 has two faces 160A and 160B arranged in the longitudinal direction of the cable 2, for example. The face 160A is situated closer to the front end (i.e., F side) than the face 160B. At the face 160A, the coaxial wires 20a to 20f are arranged side by side in the direction parallel to the face 160A (i.e., the direction indicated by an arrow A1 in this example). At the face 160B, the coaxial wires 20a to 20f are arranged side by side in the direction parallel to the face 160B (i.e., the direction indicated by an arrow B1 in this example). The face 160B is inclined at an angle $\theta_{11}$ greater than 0 degrees and less than 90 degrees relative to the face 160A. With this arrangement, the direction in which the coaxial wires 20a to 20f are arranged side by side at the face 160B as indicated by the arrow B1 is at the angle $\theta_{11}$, which is greater than 0 degrees and less than 90 degrees, relative to the direction in which the coaxial wires 20a to 20f are arranged side by side at the face 160A as indicated by the arrow A1. The coaxial wires 20a to 20f are curved inside the mold member 160. The angle $\theta_{11}$ is preferably greater than or equal to 30 degrees and less than or equal to 60 degrees. Specifically, the angle $\theta_{11}$ is set to 30 degrees, 45 degrees, 60 degrees, or the like, for example. In this example, the setting is 45 degrees. The face 160A is an example of the first face, and the face 160B is an example of the second face.

The mold member 160 further has a face 160C situated closer to the front end (i.e., F side) than the face 160B, and has a face 160D connected between the face 160C and the face 160B. At the face 160C, the insulated wires 21a and 21b are arranged side by side in the direction parallel to the face 160C. The face 160C is parallel to the face 160B, for example. The face 160C is an example of the third face. The cable 2 and the mold member 160 are included in a wire and mold-member assembly 11.

Figure 3:
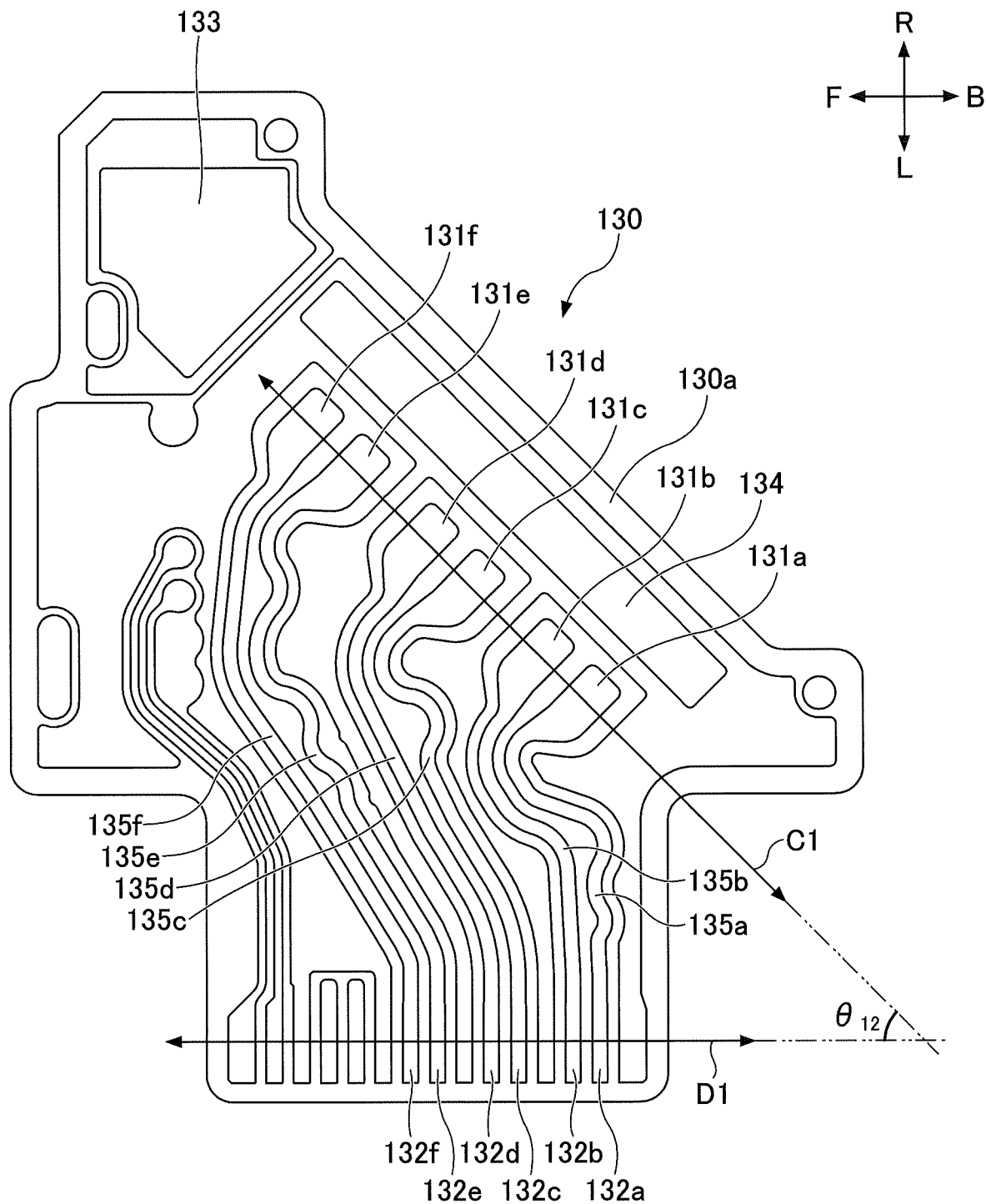
FIG. 3 is a drawing (1) illustrating the structure of a relay board of the first embodiment.

In the following, the relay board 130 will be described. FIG. 3 is a drawing illustrating the configuration of the relay board 130. FIG. 3 illustrates how the relay board 130 appears when viewed from above (i.e., from the U side).

As illustrated in FIG. 3, a plurality (six in this example) of wire pads 131a to 131f, a plurality (six in this example) of connector pads 132a to 132f, and a power supply pad 133 are formed on the surface 130a of the relay board 130. The wire pads 131a to 131f are the pads to which the coaxial wires 20a to 20f of the cable 2 are connected, respectively. The connector pads 132a to 132f are the pads to which the connector terminals 152 (see FIG. 1) of the connection part 151 are connected, respectively. The power supply pad 133 is the pad to which the insulated wires 21a and 21b of the cable 2 are connected. The wire pads 131a to 131f are examples of the first pads, and the connector pads 132a to 132f are examples of the second pads.

A circuit pattern implemented as traces 135a to 135f is formed on the surface of the relay board 130 to connect the wire pads 131a to 131f and the connector pads 132a to 132f, respectively. The traces 135a to 135f include meander lines for equalizing the line lengths of the coaxial wire 20a and the coaxial wire 20b forming a coaxial wire pair, the coaxial wire 20c and the coaxial wire 20d forming a coaxial wire pair, and the coaxial wire 20e and the coaxial wire 20f forming a coaxial wire pair. In this example, the trace 135a is implemented as a meander line to equalize the line lengths of the coaxial wire 20a and the coaxial wire 20b forming a coaxial wire pair. Similarly, the trace 135c is implemented as a meander line to equalize the line lengths of the coaxial wire 20c and the coaxial wire 20d forming a coaxial wire pair, and the trace 135e is implemented as a meander line to equalize the line lengths of the coaxial wire 20e and the coaxial wire 20f forming a coaxial wire pair.

The wire pads 131a to 131f are arranged side by side in a certain direction (i.e., the direction indicated by an arrow C1 in this example) on the surface of the relay board 130. Similarly, the connector pads 132a to 132f are arranged side by side in the direction indicated by an arrow D1. The direction indicated by the arrow D1 in which the connector pads 132a to 132f are arranged side by side is at an angle $\theta_{12}$, which is greater than 0 degrees and less than 90 degrees, to the direction indicated by the arrow C1 in which the wire pads 131a to 131f are arranged side by side. The angle $\theta_{12}$ is preferably greater than or equal to 30 degrees and less than or equal to 60 degrees. Specifically, the angle $\theta_{12}$ is set to 30 degrees, 45 degrees, 60 degrees, or the like, for example. As an example, the sum of the angle $\theta_{11}$ and the angle $\theta_{12}$ is equal to 90 degrees, for example, which is the angle between the direction in which the cable 2 extends from the housing 150 (i.e., the B direction) and the direction in which the connection part 151 protrudes from the housing 150 (i.e., the L direction). The direction in which the wire pads 131a to 131f are arranged side by side is an example of the first direction. The direction in which the connector pads 132a to 132f are arranged side by side is an example of the second direction.

The power supply pad 133 is connected to the back surface of the relay board 130 through a through-hole so as to be coupled to a power-supply circuit pattern formed on the back surface. The configuration in which the power supply line and the circuit pattern of the traces 135a to 135f are spaced apart in the thickness direction of the relay board 130 reduces the influence of noise on the high-speed signals transmitted through the traces 135a to 135f, and also allows the size of the relay board 130 to be reduced.

Inside the housing 150 as illustrated in FIG. 2 and FIG. 3, the exposed center conductors 24 of the coaxial wires 20a to 20f are soldered to the wire pads 131a to 131f of the relay board 130, respectively, and the exposed outer conductors 26 are soldered to a ground pad 134 of the relay board 130. The face 160A of the mold member 160 is parallel to the direction in which the wire pads 131a to 131f are aligned.

Namely, the direction in which the portions of the coaxial wires 20a to 20f protruding from the face 160A are arranged side by side (i.e., the direction indicated by the arrow A1) is parallel to the direction in which the wire pads 131a to 131f are aligned (i.e., the direction indicated by the arrow C1). Further, the connector pads 132a to 132f are aligned in the direction perpendicular to the face 160B of the mold member 160. Namely, the direction in which the portions of the coaxial wires 20a to 20f extending from the face 160B are arranged side by side (i.e., the direction indicated by the arrow B1) is parallel to the direction in which the connector pads 132a to 132f are aligned (i.e., the direction indicated by the arrow D1). Inside the housing 150, further, the exposed conductors 27 of the insulated wires 21a and 21b are soldered to the power supply pad 133 of the relay board 130.

The bundling unit 123 is secured to the housing 150 such that the connector pads 132a to 132f are arranged side by side in the same direction as the connector terminals 152 are arranged side by side in the connection part 151. The relay board 130 is secured to the housing 150 such that the direction in which the cable 2 extends from the housing 150 is the same as the direction in which the connector pads 132a to 132f are arranged side by side. As a result, the direction indicated by the arrow A1 and the direction indicated by the arrow C1 are parallel to each other, and the direction indicated by the arrow B1 and the direction indicated by the arrow D1 are perpendicular to each other.

Figure 4:
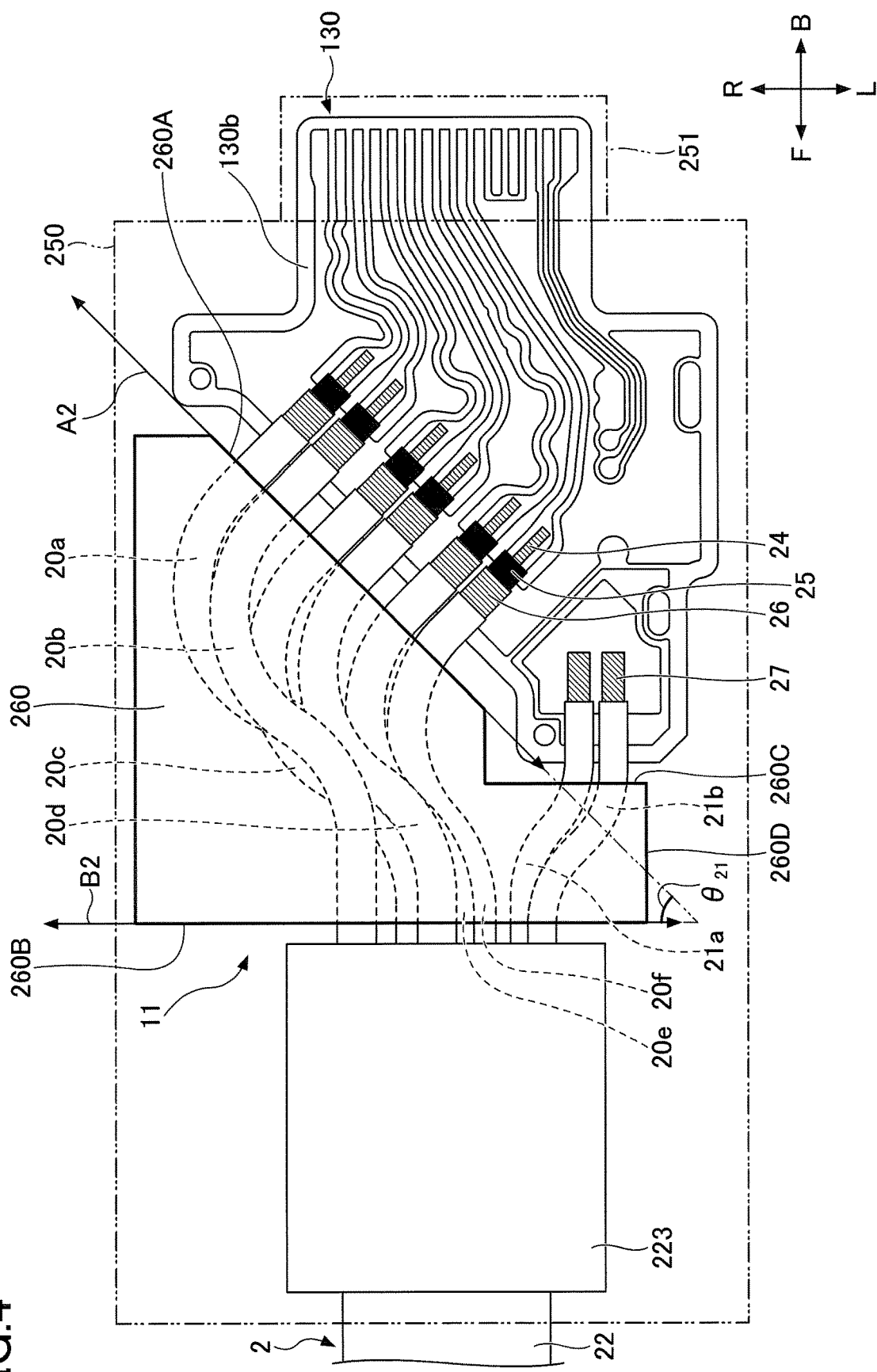
FIG. 4 is a drawing (2) illustrating the internal structure of a connector of the first embodiment.

In the following, the internal structure of the connector 200 will be described. FIG. 4 is a drawing illustrating the internal structure of the connector 200 of the first embodiment. FIG. 4 illustrates how the inside of the connector 200 appears when viewed from above (i.e., from the U side).

As illustrated in FIG. 4, the coaxial wires 20a to 20f and the insulated wires 21a and 21b are also exposed beyond the cable outer sheath 22 at the back (i.e., B-side) end of the cable 2, and are bundled by a bundling unit 223, for example. The coaxial wires 20a to 20f exposed beyond the cable outer sheath 22 are such that respective predetermined lengths (i.e., lengths set in advance) of a center conductor 24, an insulator 25, and an outer conductor 26 are exposed in a step-wise manner. Further, the insulated wires 21a and 21b exposed beyond the cable outer sheath 22 are configured such that an insulation at the tip is removed to expose a conductor 27.

The connector 200 includes a housing 250 in which the bundling unit 223 and the back (i.e., B-side) portions of the coaxial wires 20a to 20f and the insulated wires 21a and 21b extending beyond the bundling unit 223 are stored in the housing 250. The bundling unit 223 also has the function to secure the cable 2 to the housing 250. The housing 250 also stores a relay board 230 connected to the coaxial wires 20a to 20f and to the insulated wires 21a and 21b. A connection part 251 forms part of the housing 150. A plurality of connector terminals 252 are provided inside the connection part 251 (see FIG. 1). The cable 2 and the connector terminals 252 are connected to the relay board 230 inside the housing 250.

The connector 200 includes a mold member 260 which bundles the back (i.e., B side) portions of the coaxial wires 20a to 20f and the insulated wires 21a and 21b extending beyond the bundling unit 223. The mold member 260 organizes the arrangement of the back (i.e., B side) portions of the coaxial wires 20a to 20f and the insulated wires 21a and 21b extending beyond the bundling unit 223. The exposed portions of the center conductor 24, the insulator 25, and the outer conductor 26 of the coaxial wires 20a to 20f and the portion of the conductor 27 of the insulated wires 21a and 21b which is exposed upon removing the insulation are exposed beyond the mold member 260.

The mold member 260 has two faces 260A and 260B arranged in the longitudinal direction of the cable 2, for example. The face 260A is situated closer to the back end (i.e., B side) than the face 260B. At the face 260A, the coaxial wires 20a to 20f are arranged side by side in the direction parallel to the face 260A (i.e., the direction indicated by an arrow A2 in this example). At the face 260B, the coaxial wires 20a to 20f are arranged side by side in the direction parallel to the face 260B (i.e., the direction indicated by an arrow B2 in this example). The face 260B is inclined at an angle $\theta_{21}$ greater than 0 degrees and less than 90 degrees relative to the face 260A. With this arrangement, the direction in which the coaxial wires 20a to 20f are arranged side by side at the face 260B as indicated by the arrow B2 is at the angle $\theta_{21}$, which is greater than 0 degrees and less than 90 degrees, relative to the direction in which the coaxial wires 20a to 20f are arranged side by side at the face 260A as indicated by the arrow A2. The coaxial wires 20a to 20f are curved inside the mold member 260. The angle $\theta_{21}$ is preferably greater than or equal to 30 degrees and less than or equal to 60 degrees. Specifically, the angle $\theta_{21}$ is set to 30 degrees, 45 degrees, 60 degrees, or the like, for example. In this example, the setting is 45 degrees. The face 260A is an example of the first face, and the face 260B is an example of the second face.

The mold member 260 further has a face 260C situated closer to the back end (i.e., B side) than the face 260B, and has a face 260D connected between the face 260C and the face 260B. At the face 260C, the insulated wires 21a and 21b are arranged side by side in the direction parallel to the face 260C. The face 260C is parallel to the face 260B, for example. The face 260C is an example of the third face. The cable 2 and the mold member 260 are included in a wire and mold-member assembly 11.

Figure 5:
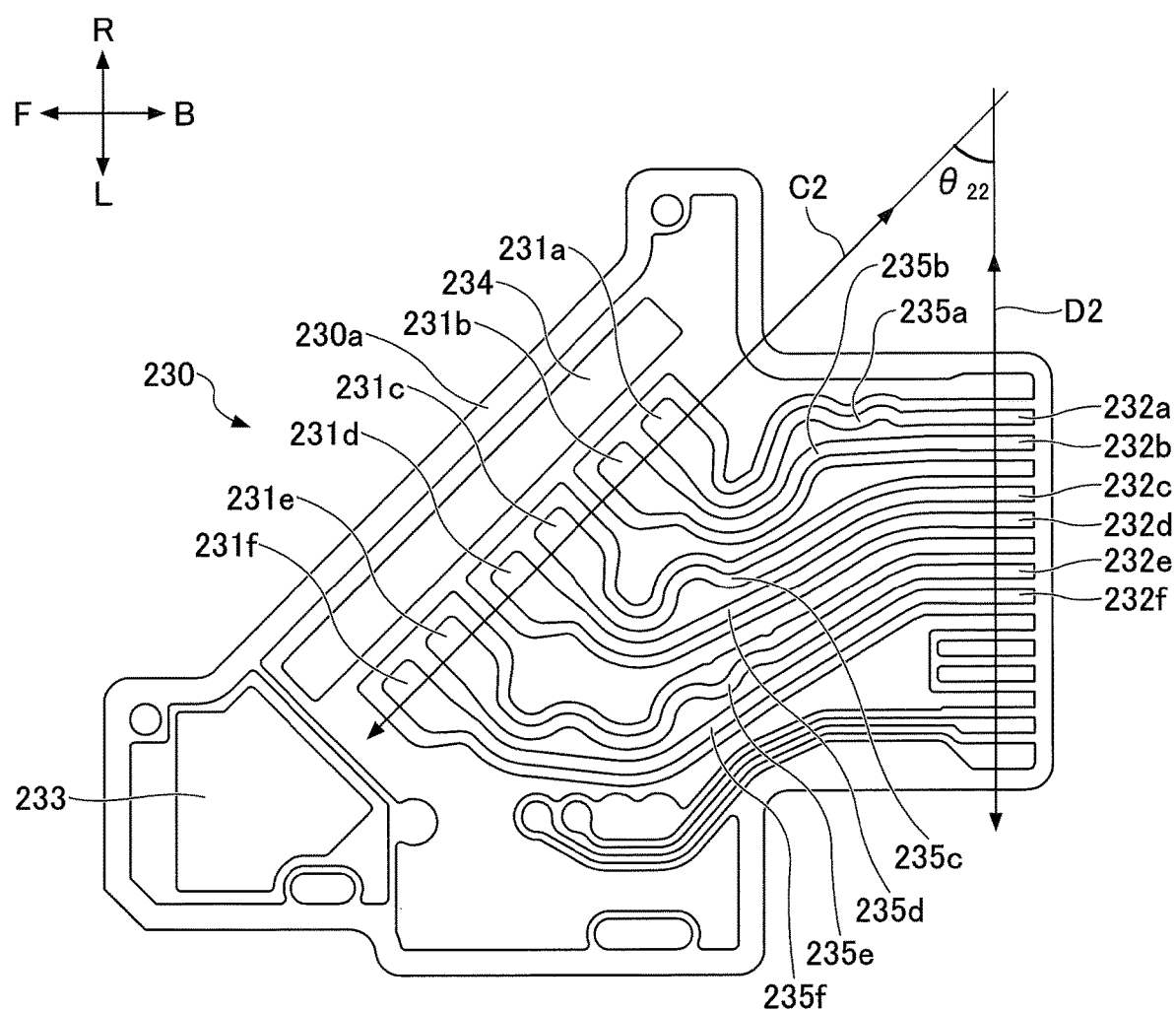
FIG. 5 is a drawing (2) illustrating the structure of a relay board of the first embodiment.

In the following, the relay board 230 will be described. FIG. 5 is a drawing illustrating the configuration of the relay board 230. FIG. 5 illustrates how the relay board 230 appears when viewed from above (i.e., from the U side).

The relay board 230 has the same or similar configuration as the relay board 130. Namely, as illustrated in FIG. 5, a plurality (six in this example) of wire pads 231a to 231f, a plurality (six in this example) of connector pads 232a to 232f, and a power supply pad 233 are formed on the surface 230a of the relay board 230. The wire pads 231a to 231f are the pads to which the coaxial wires 20a to 20f of the cable 2 are connected, respectively. The connector pads 232a to 232f are the pads to which the connector terminals 252 (see FIG. 1) of the connection part 251 are connected, respectively. The power supply pad 233 is the pad to which the insulated wires 21a and 21b of the cable 2 are connected. The wire pads 231a to 231f are examples of the first pads, and the connector pads 232a to 232f are examples of the second pads.

A circuit pattern implemented as traces 235a to 235f is formed on the surface of the relay board 230 to connect the wire pads 231a to 231f and the connector pads 232a to 232f, respectively. The traces 235a to 235f include meander lines for equalizing the line lengths of the coaxial wire 20a and the coaxial wire 20b forming a coaxial wire pair, the coaxial wire 20c and the coaxial wire 20d forming a coaxial wire pair, and the coaxial wire 20e and the coaxial wire 20f forming a coaxial wire pair. In this example, the trace 235a is implemented as a meander line to equalize the line lengths of the coaxial wire 20a and the coaxial wire 20b forming a coaxial wire pair. Similarly, the trace 235c is implemented as a meander line to equalize the line lengths of the coaxial wire 20c and the coaxial wire 20d forming a coaxial wire pair, and the trace 235e is implemented as a meander line to equalize the line lengths of the coaxial wire 20e and the coaxial wire 20f forming a coaxial wire pair.

The wire pads 231a to 231f are arranged side by side in a certain direction (i.e., the direction indicated by an arrow C2 in this example) on the surface of the relay board 230. Similarly, the connector pads 232a to 232f are arranged side by side in the direction indicated by an arrow D2. The direction indicated by the arrow D2 in which the connector pads 232a to 232f are arranged side by side is at an angle $\theta_{22}$, which is greater than 0 degrees and less than 90 degrees, to the direction indicated by the arrow C2 in which the wire pads 231a to 231f are arranged side by side. The angle $\theta_{22}$ is preferably greater than or equal to 30 degrees and less than or equal to 60 degrees. Specifically, the angle $\theta_{22}$ is set to 30 degrees, 45 degrees, 60 degrees, or the like, for example. The angle $\theta_{21}$ and the angle $\theta_{22}$ are equal to each other, for example. The direction in which the wire pads 231a to 231f are arranged side by side is an example of the first direction. The direction in which the connector pads 232a to 232f are arranged side by side is an example of the second direction.

The power supply pad 233 is connected to the back surface of the relay board 230 through a through-hole so as to be coupled to a power-supply circuit pattern formed on the back surface. The configuration in which the power supply line and the circuit pattern of the traces 235a to 235f are spaced apart in the thickness direction of the relay board 230 reduces the influence of noise on the high-speed signals transmitted through the traces 235a to 235f, and also allows the size of the relay board 230 to be reduced.

Inside the housing 250 as illustrated in FIG. 4 and FIG. 5, the exposed center conductors 24 of the coaxial wires 20a to 20f are soldered to the wire pads 231a to 231f of the relay board 230, respectively, and the exposed outer conductors 26 are soldered to a ground pad 234 of the relay board 230. The face 260A of the mold member 260 is parallel to the direction in which the wire pads 231a to 231f are aligned. Namely, the direction in which the portions of the coaxial wires 20a to 20f protruding from the face 260A are arranged side by side (i.e., the direction indicated by the arrow A2) is parallel to the direction in which the wire pads 231a to 231f are aligned (i.e., the direction indicated by the arrow C2). The face 260B of the mold member 260 is parallel to the direction in which the connector pads 232a to 232f are aligned. Namely, the direction in which the portions of the coaxial wires 20a to 20f extending from the face 260B are arranged side by side (i.e., the direction indicated by the arrow B2) is parallel to the direction in which the connector pads 232a to 232f are aligned (i.e., the direction indicated by the arrow D2). Inside the housing 250, further, the exposed conductors 27 of the insulated wires 21a and 21b are soldered to the power supply pad 233 of the relay board 230.

The bundling unit 223 is secured to the housing 250 such that the connector pads 232a to 232f are arranged side by side in the same direction as the connector terminals 252 are arranged side by side in the connection part 251. The relay board 230 is secured to the housing 250 such that the direction in which the cable 2 extends from the housing 250 is perpendicular the direction in which the connector pads 232a to 232f are arranged side by side. As a result, the direction indicated by the arrow A2 and the direction indicated by the arrow C2 are parallel to each other, and the direction indicated by the arrow B2 and the direction indicated by the arrow D2 are parallel to each other.

In the first embodiment, the coaxial wires 20a to 20f are encapsulated in the mold member 160 inside the right-angle connector 100, so that the coaxial wires 20a to 20f are less likely to be disengaged from the connector 100. Further, the face 160B of the mold member 160 is inclined at an angle $\theta_{11}$ greater than 0 degrees and less than 90 degrees relative to the face 160A. Moreover, the coaxial wires 20a to 20f, which are curved inside the mold member 160, are arranged side by side at the face 160A in the direction parallel to the face 160A, and are arranged side by side at the face 160B in the direction parallel to the face 160B. Compared with the case in which the coaxial wires 20a to 20f are bent at a right angle, this arrangement can reduce a difference in line length between the coaxial wire 20a and the coaxial wire 20b, a difference in line length between the coaxial wire 20c and the coaxial wire 20d, and a difference in line length between the coaxial wire 20e and the coaxial wire 20f. Accordingly, the area used on the relay board 130 for meander lines to absorb line length differences can be reduced.

Also, because the minimum bending radius requirements are imposed on the coaxial wires 20a to 20f, the larger the angle $\theta_{11}$ is, the greater the space needed for the coaxial wires 20a to 20f inside the connector is. In the first embodiment, the angle $\theta_{11}$ is greater than 0 degrees and less than 90 degrees, so that an increase in the space needed for bending the coaxial wires 20a to 20f inside the connector 100 can be reduced.

Furthermore, the mold member 160 bundles the front (i.e., F side) portions of the coaxial wires 20a to 20f and the insulated wires 21a and 21b extending beyond the bundling unit 123, so that the coaxial wires 20a to 20f and the insulated wires 21a and 21b can be stably connected to the wire pads 131a to 131f. Differences in line length between the coaxial wires 20a to 20f may need to be controlled with high precision. The ability to provide stable connection is thus highly preferable. The coaxial wires 20a to 20f can be soldered simultaneously. The insulated wires 21a and 21b can be soldered simultaneously. The coaxial wires 20a to 20f and the insulated wires 21a and 21b may be soldered simultaneously. When the diameter of the center conductor 24 and the diameter of the conductor 27 are not the same, however, it may be preferable that one of these is soldered first and the other one is soldered next.

With respect to the relay board 130, the direction in which the wire pads 131a to 131f are arranged side by side is inclined at an angle greater than 0 degrees and less than 90 degrees relative to the direction in which the connector pads 132a to 132f are arranged side by side. This arrangement allows the coaxial wires 20a to 20f secured to the mold member 160 to be readily connected to the wire pads 131a to 131f, respectively. Further, as was previously described, the area used on the relay board 130 for meander lines to absorb line length differences can be reduced. The size of the connector 100 can thus be reduced. Further, shortening the traces 135a to 135f serves to maintain the high quality of high-speed signal transmission.

Figure 6:
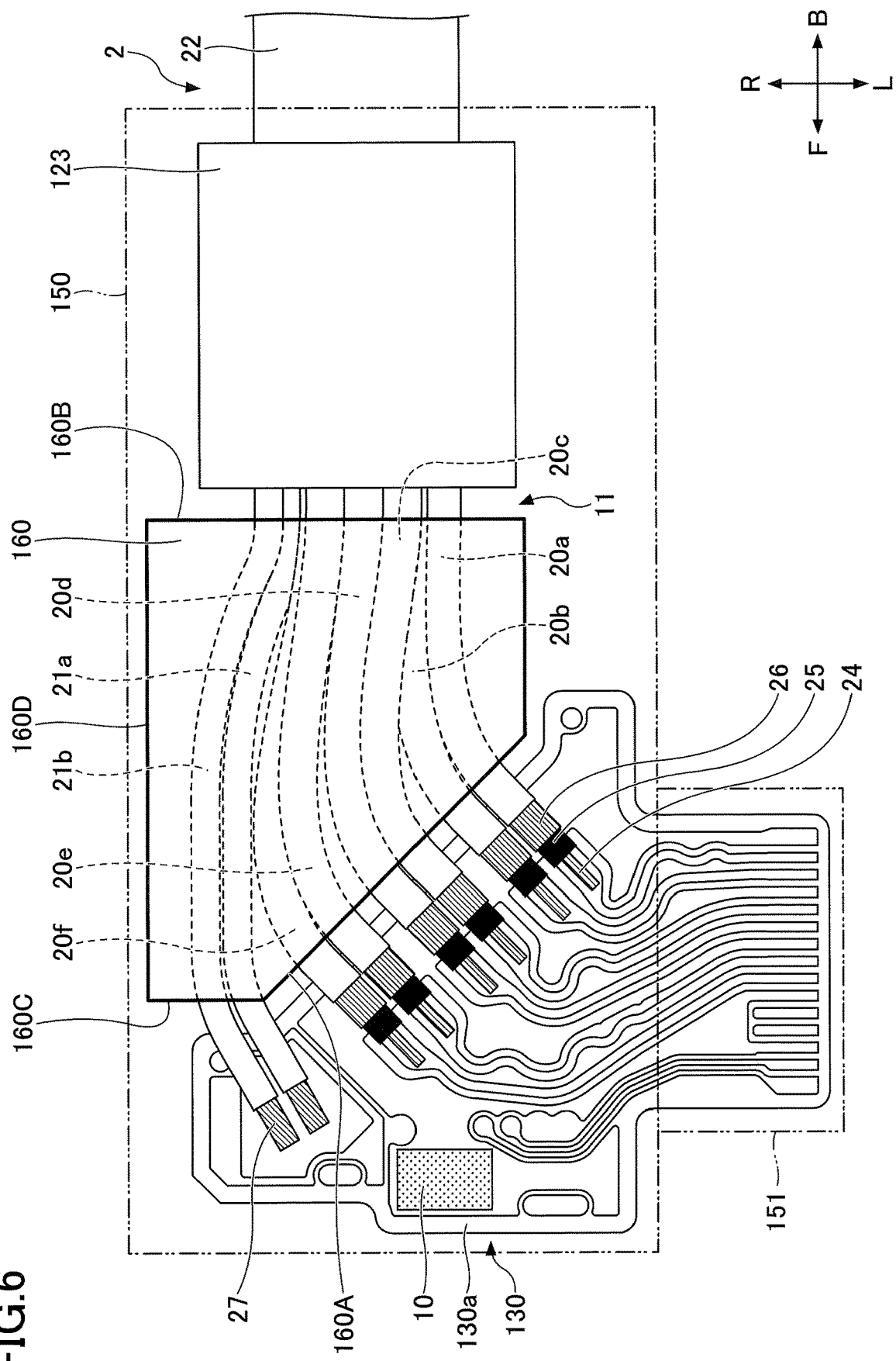
FIG. 6 is a drawing (1) illustrating the structure of a relay board according to a variation of the first embodiment.

Further, according to the first embodiment, the space inside the housing 150 can be efficiently utilized, which allows an electronic component 10 to be mounted on the relay board 130 as illustrated in FIG. 6. Examples of the electronic component 10 include a re-driver integrated circuit (IC) chip for signal correction, a re-timer IC chip, an IC chip for ID recognition (e.g., eMarker), an electronic component for overcurrent prevention, a component for rush-current prevention, a component for preventing a temperature increase, and the like.

The component for preventing a temperature increase is the device that interrupts current flow in response to a temperature increase of a re-driver IC chip for signal correction, such as a circuit breaker, a fuse, etc. The relay board 130 is preferably equipped with a re-driver IC chip for signal correction and a component for preventing a temperature increase. Between the wire pads 131a to 131f and the connector terminals 152, the component for preventing a temperature increase is connected to a re-driver IC chip for signal correction to prevent the temperature of the relay board 130 from increasing due to an increase in the temperature of the re-driver IC chip for signal correction. The component for preventing a temperature increase is connected to a conducting line which is preferably connected to a pad used for the CC (i.e., configuration channel for checking cable connection) of the connector or a pad used for Vconn (which serves to supply power to the IC). Particularly, in applications in which power is supplied only at one side (i.e., source or host side) of the cable, the side (i.e., sink side or device side) to which power is not supplied preferably has a component for preventing a temperature increase mounted between the wire pads 131a to 131f and a re-driver IC chip for signal correction.

In the first embodiment, the coaxial wires 20a to 20f are encapsulated in the mold member 260 inside the straight connector 200, so that the coaxial wires 20a to 20f are less likely to be disengaged from the connector 200. Further, the face 260B of the mold member 260 is inclined at an angle $\theta_{21}$ greater than 0 degrees and less than 90 degrees relative to the face 260A. Moreover, the coaxial wires 20a to 20f, which are curved inside the mold member 260, are arranged side by side at the face 260A in the direction parallel to the face 260A, and are arranged side by side at the face 260B in the direction parallel to the face 260B.

With respect to the relay board 230, the direction in which the wire pads 231a to 231f are arranged side by side is inclined at an angle greater than 0 degrees and less than 90 degrees relative to the direction in which the connector pads 232a to 232f are arranged side by side. This arrangement allows the coaxial wires 20a to 20f secured to the mold member 260 to be readily connected to the wire pads 231a to 231f, respectively.

Furthermore, the mold member 260 bundles the back (i.e., B side) portions of the coaxial wires 20a to 20f and the insulated wires 21a and 21b extending beyond the bundling unit 223, so that the coaxial wires 20a to 20f and the insulated wires 21a and 21b can be stably connected to the wire pads 231a to 231f. Differences in line length between the coaxial wires 20a to 20f may need to be controlled with high precision. The ability to provide stable connection is thus highly preferable.

Figure 7:
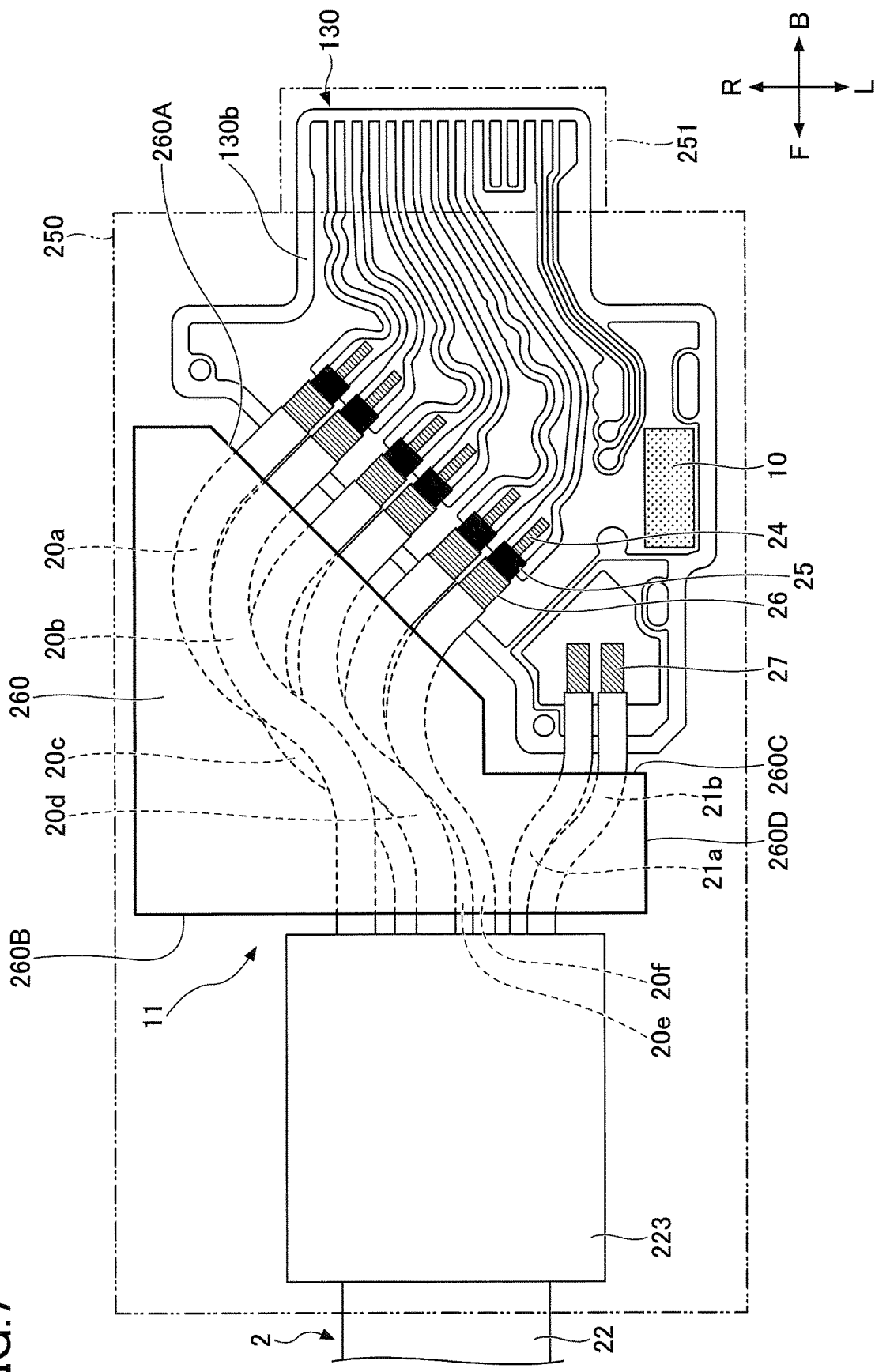
FIG. 7 is a drawing (2) illustrating the structure of a relay board according to a variation of the first embodiment.

The traces 235a to 235f include meander lines, but the combination of the curved coaxial wires 20a to 20f and the meander lines allows space inside the housing 250 to be efficiently utilized. This arrangement may thus allow the electronic component 10 to be mounted on the relay board 230 as illustrated in FIG. 7.

Figure 8:
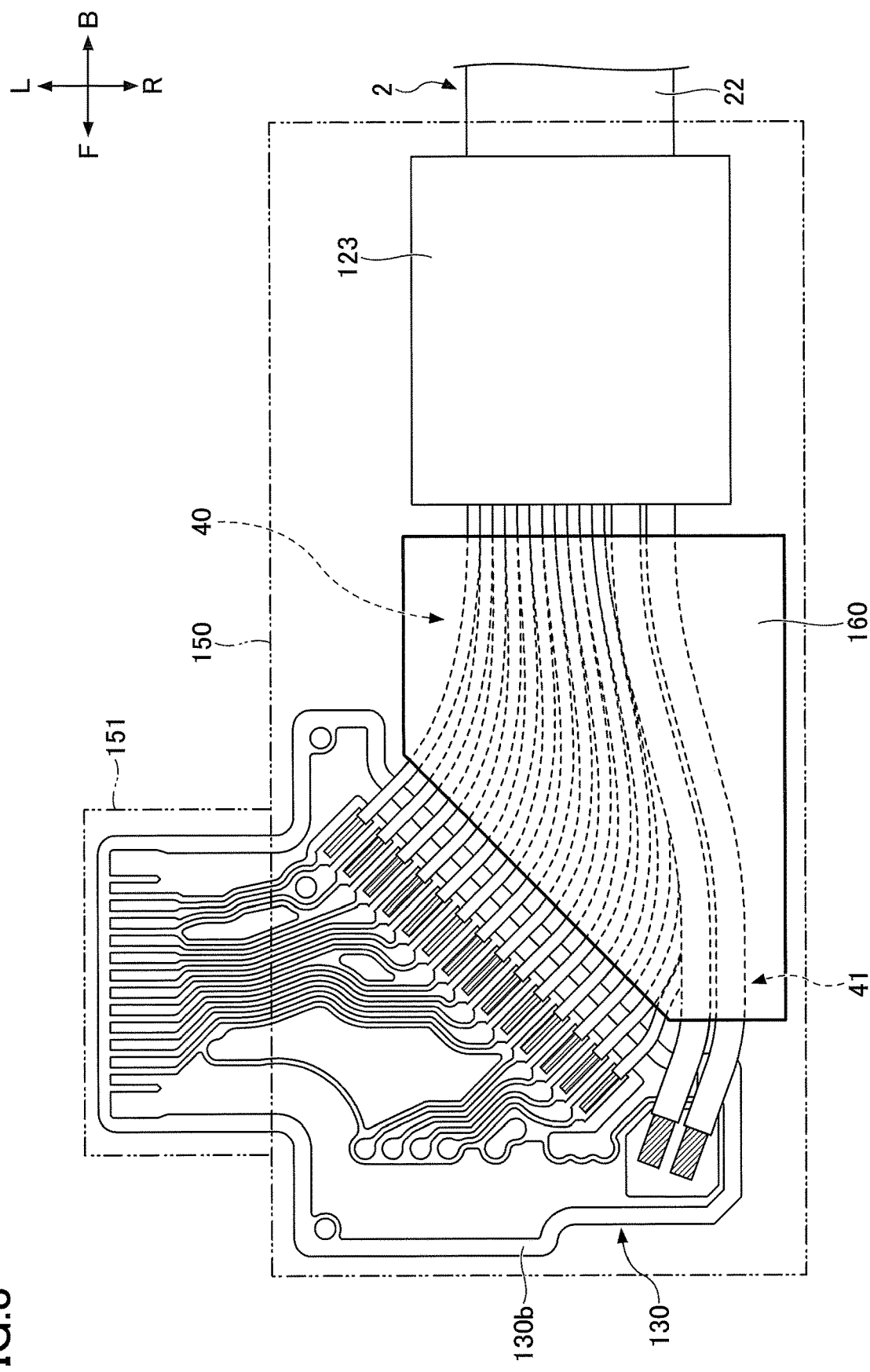
FIG. 8 is a drawing (3) illustrating the structure of a relay board according to a variation of the first embodiment.
Figure 9:
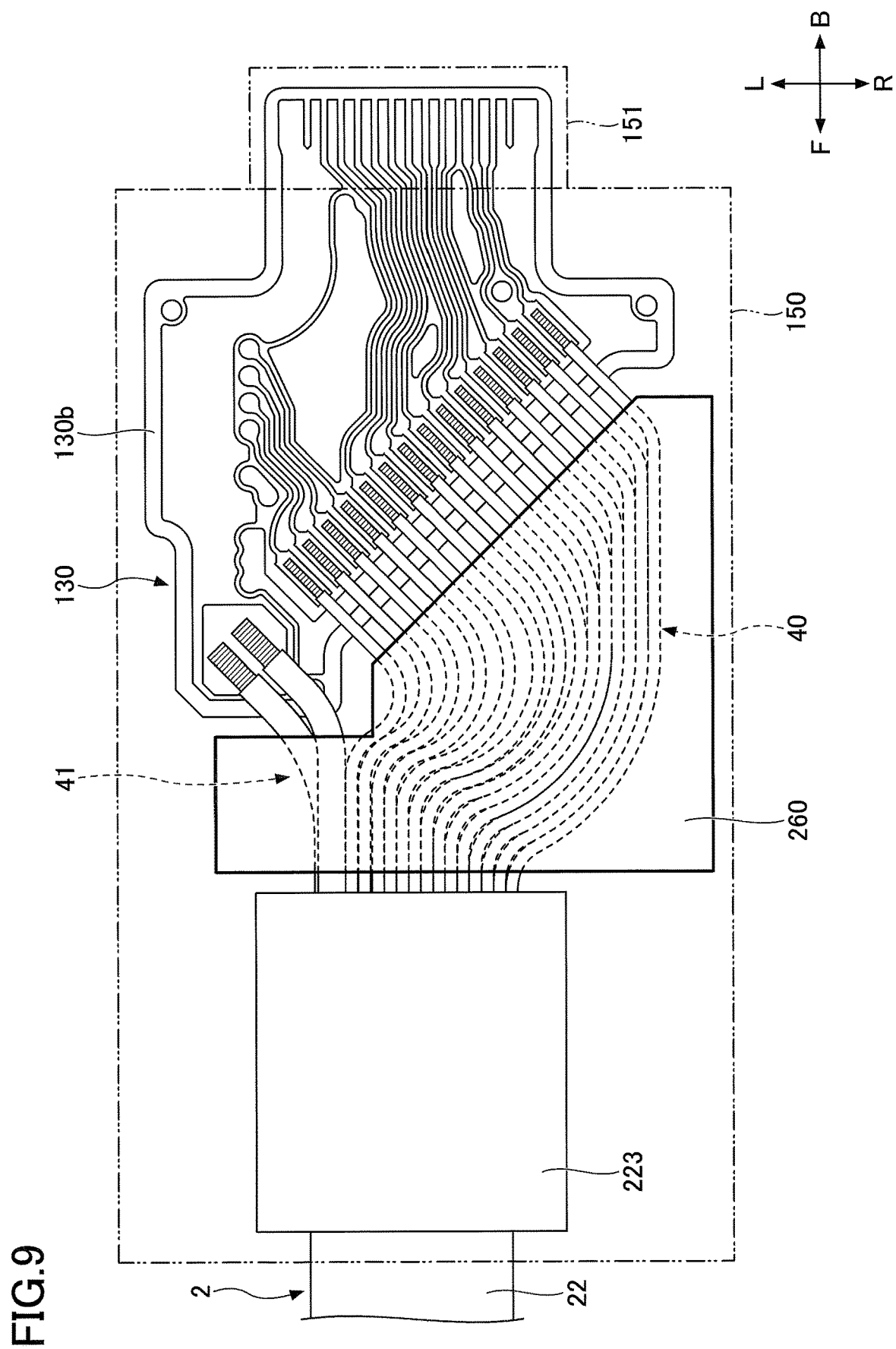
FIG. 9 is a drawing (4) illustrating the structure of a relay board according to a variation of the first embodiment.

The cable 2 may further include an insulated wire for low-speed signal transmission. FIG. 8 is a drawing illustrating the configuration of the relay board 130, and FIG. 9 is a drawing illustrating the configuration of the relay board 230. FIG. 8 illustrates how the relay board 130 appears when viewed from below (i.e. from the D side), and FIG. 9 illustrates how the relay board 230 appears when viewed from below (from the D side). As illustrated in FIG. 8, the cable 2 includes insulated wires 40 for low-speed signal transmission and insulated wires 41 for power supply, and the insulated wires 40 and 41 may be connected to the back surface 130b of the relay board 130 inside the connector 100. Moreover, as illustrated in FIG. 9, the insulated wires 40 and 41 may be connected to the back surface 230b of the relay board 230 inside the connector 200.

In the present embodiment, as illustrated in FIG. 2 and FIG. 8, the coaxial wires 20a to 20f for differential transmission are connected to the surface 130a of the relay board 130, and the insulated wires 40 for low-speed signal transmission are connected to the back surface 130b of the relay board 130. In this configuration, the differential transmission lines for high-speed signal transmission and the lines for low-speed signal transmission are not mixed on the same surface of the relay board 130. This arrangement thus serves to reduce electrical interference such as crosstalk and noise transmission between the low-speed signal lines and the high-speed signal lines.

In the present embodiment, as illustrated in FIG. 4 and FIG. 9, the coaxial wires 20a to 20f for differential transmission are connected to the surface 230a of the relay board 230, and the insulated wires 40 for low-speed signal transmission are connected to the back surface 230b of the relay board 230. In this configuration, the differential transmission lines for high-speed signal transmission and the lines for low-speed signal transmission are not mixed on the same surface of the relay board 230. This arrangement thus serves to reduce electrical interference such as crosstalk and noise transmission between the low-speed signal lines and the high-speed signal lines.

On the other hand, if high-speed signal lines and low-speed signal transmission lines were in a mixed arrangement, these lines would need to be separated by a long distance. Otherwise electrical interference as noted above would become noticeable. According to the present embodiment, electrical interference and the like can be reduced even when the distance between lines is shortened, which allows the size of the relay boards 130 and 230 to be reduced.

In addition, the relay boards 130 and 230 may be implemented as a multilayer board, and a power-supply circuit pattern may then be formed on an inner layer of the board. Such a configuration allows the area usable for a power-supply circuit pattern to be increased. This further reduces the effect of noise through the advantage of lower power-supply impedance. Further, it suffices for the area used for a power-supply circuit pattern on the surface of the relay boards 130 and 230 to be small, the size of the relay boards 130 and 230 can be further reduced.

Also, in the case in which no lines for low-speed signal transmission are used, for example, both the front surface and the back surface of the relay boards 130 and 230 may be used for connection to the coaxial wires for differential transmission.

Although a pair of two coaxial wires is used for differential transmission, this is not a limiting example. For example, differential transmission wires may be implemented as a twisted pair wire or the like, which is made by winding two insulated wires together to form a twisted pair which is then shielded by a shield layer.

Figure 10A:
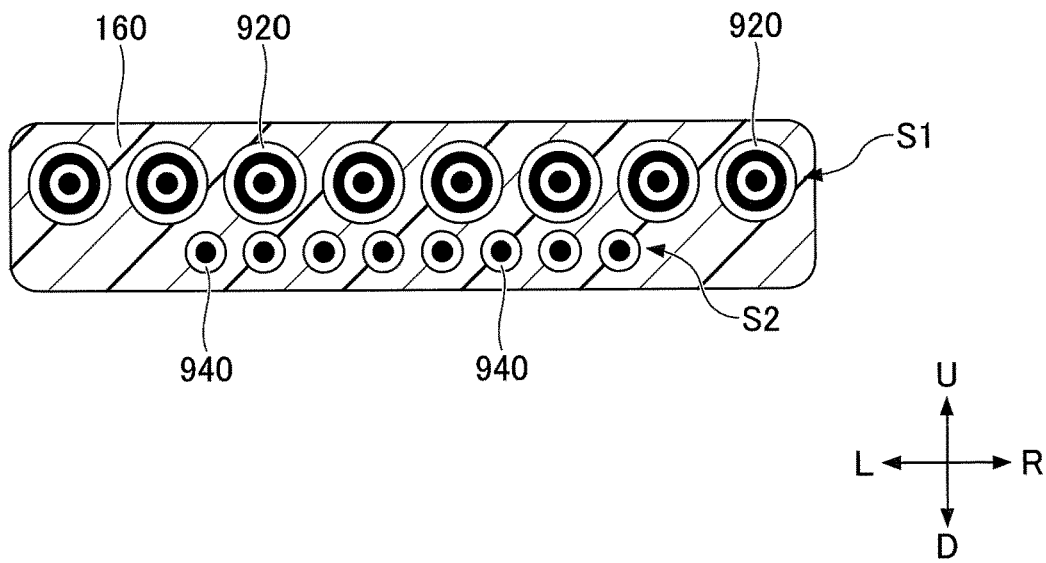
FIG. 10A is a drawing illustrating an example of the arrangement of electric wires inside the mold member.
Figure 10B:
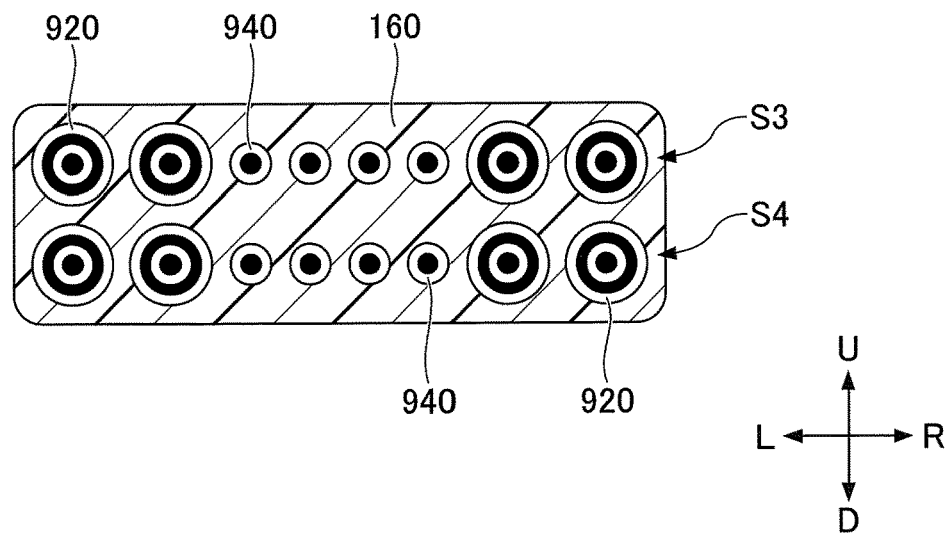
FIG. 10B is a drawing illustrating another example of the arrangement of electric wires inside the mold member.
Figure 10C:
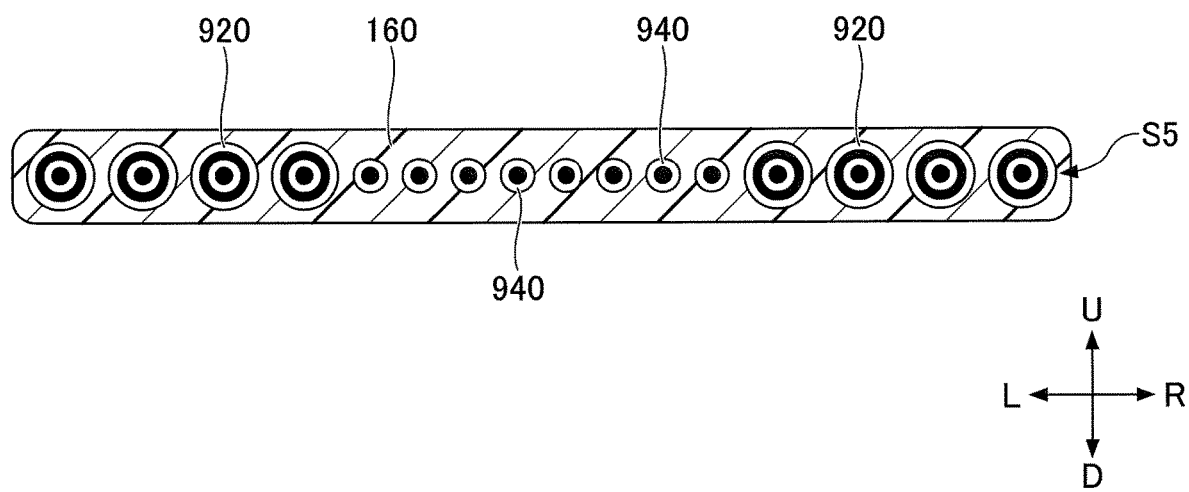
FIG. 10C is a drawing illustrating yet another example of the arrangement of electric wires inside the mold member.

The arrangement of electric wires in the mold members 160 and 260 is not limited. For example, electric wires may be arranged in one row, or may alternatively be arranged in two rows. For example, as illustrated in FIG. 10A, two rows for arrangement may be provided in the mold member 160, such that coaxial wires 920 may be arranged in one row S1, and insulated wires 940 may be arranged in the other row S2. As another example, as illustrated in FIG. 10B, two rows for arrangement may be provided in the mold member 160, such that some of the coaxial wires 920 and some of the insulated wires 940 may be arranged in one row S3, and the remaining ones of the coaxial wires 920 and the remaining ones of the insulated wires 940 may be arranged in the other row S4. As yet another example, as illustrated in FIG. 10C, the coaxial wires 920 and the insulated wires 940 may be arranged in the same row S5 inside the mold member 160. Coaxial wires 620 may be arranged in such a fashion as to be easily connected to the relay board 130 or 230, depending on the configuration of the relay board 130 or 230. Although FIGS. 10A through 10C illustrate four coaxial wires 920 and four isolated wires 940, these numbers of coaxial wires 920 and insulated wires 940 are non-limiting. For example, the coaxial wires 20a to 20f are examples of the coaxial wires 920, and the insulated wires 21a and 21b are examples of the insulated wires 940.

Second Embodiment

Figure 11:
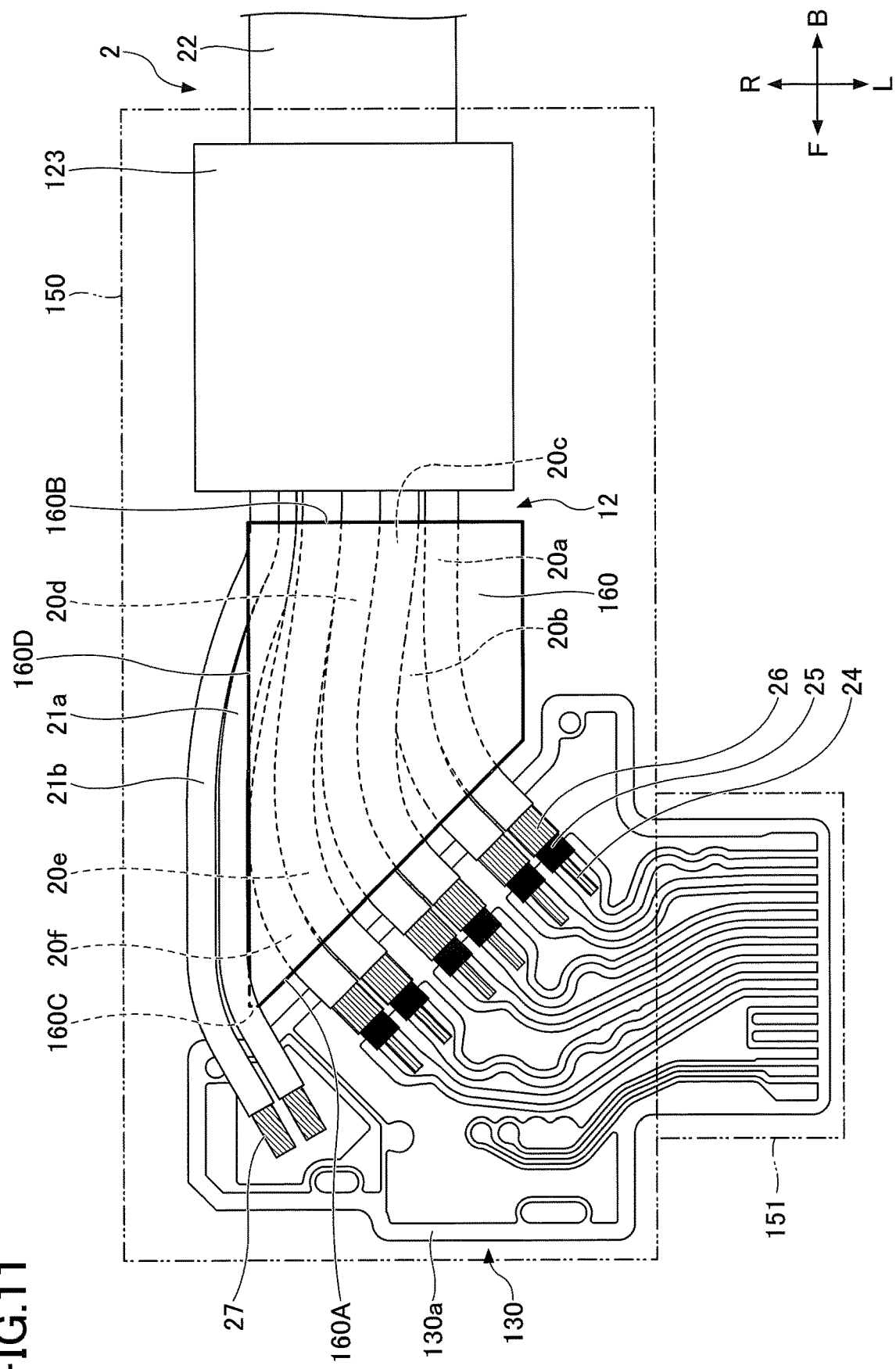
FIG. 11 is a drawing illustrating the internal structure of a connector of the second embodiment.

In the following, a second embodiment will be described. The second embodiment differs from the first embodiment in the relationships between the mold member 160 and the insulated wires 21a and 21b. FIG. 11 is a drawing illustrating the internal structure of the connector 100 of the second embodiment.

In the second embodiment illustrated in FIG. 11, the mold member 160 is provided to bundle the front (i.e., F side) portions of the coaxial wires 20a to 20f and the insulated wires 21a and 21b extending beyond the bundling unit 123. The mold member 160 organizes the arrangement of the front (i.e., F side) portions of the coaxial wires 20a to 20f and the insulated wires 21a and 21b extending beyond the bundling unit 123. It may be noted, however, that the coaxial wires 20a to 20f extend from the face 160D unlike those of the first embodiment. The face 160D is an example of the third face. The cable 2 and the mold member 160 are included in a wire and mold-member assembly 12. The remaining configurations are the same as or similar to the configurations of the first embodiment.

The second embodiment brings about the same or similar advantages as those of the first embodiment. In the second embodiment, further, the front (i.e., F side) portions of the insulated wires 21a and 21b extending beyond the mold member 160 are longer than those of the first embodiment. At the time of soldering the conductors 27 to the power supply pad 133, thus, the positions of the insulated wires 21a and 21b are readily adjustable. Namely, the second embodiment allows more freedom in the choice of positions of the insulated wires 21a and 21b inside the connector 100.

It may be noted that the insulated wires 21a and 21b may also extend from the face 260D in the connector 200. In this case, the face 260D is an example of the third face, and there is more freedom in the choice of positions of the insulated wires 21a and 21b in the connector 200.

Third Embodiment

Figure 12:
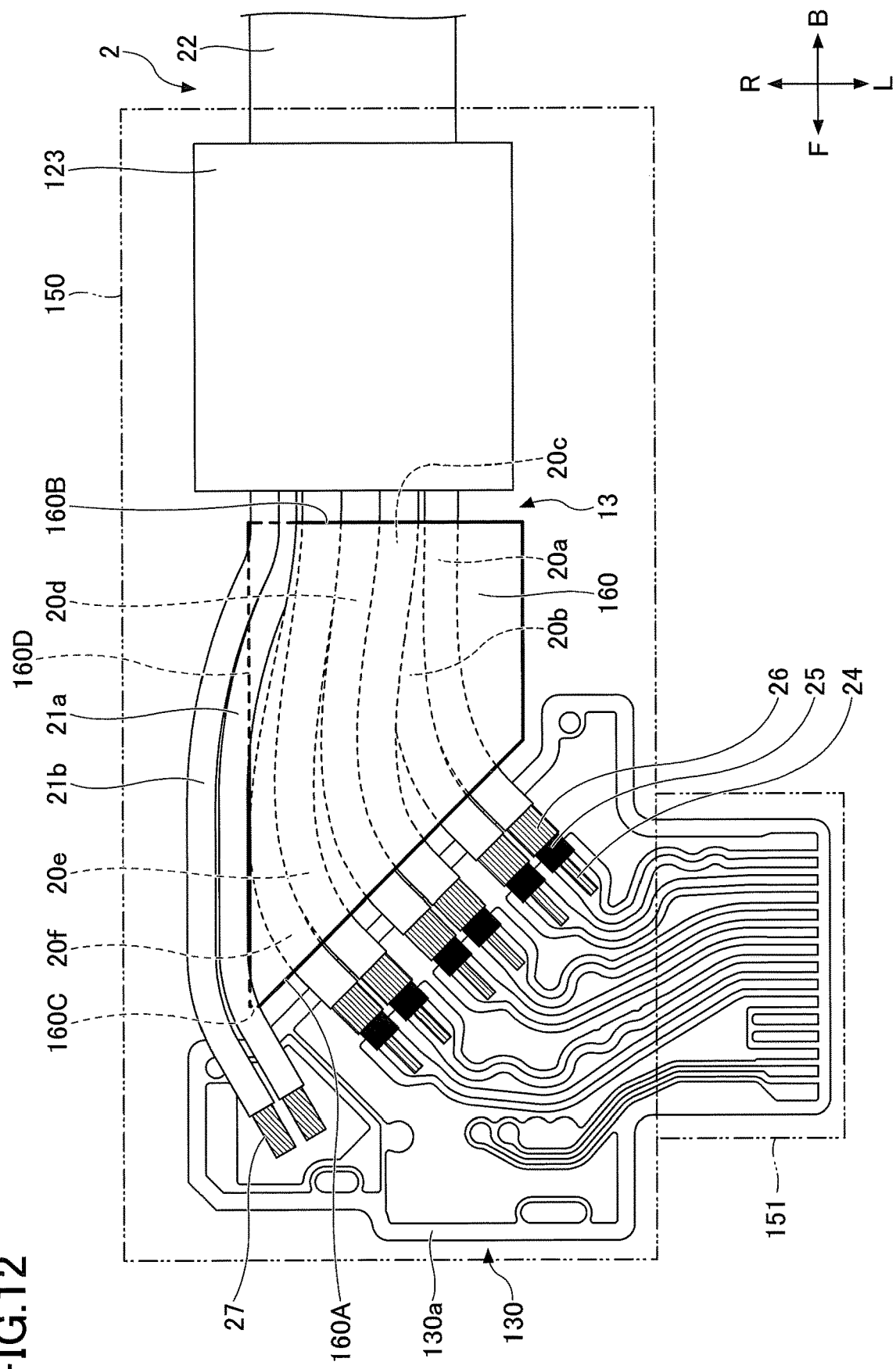
FIG. 12 is a drawing illustrating the internal structure of a connector of the third embodiment.

In the following, a third embodiment will be described. The third embodiment differs from the first embodiment in the relationships between the mold member 160 and the insulated wires 21a and 21b. FIG. 12 is a drawing illustrating the internal structure of the connector 100 of the third embodiment.

As illustrated in FIG. 12, the mold member 160 of the third embodiment bundles the front (i.e., F side) portions of the coaxial wires 20a to 20f extending beyond the bundling unit 123, while the front (i.e., F side) portions of the insulated wires 21a and 21b extending beyond the bundling unit 123 are disposed outside the mold member 160. Namely, the front (i.e., F side) portions of the insulated wires 21a and 21b extending beyond the bundling unit 123 are independent of the mold member 160. The mold member 160 organizes the arrangement of the front (i.e., F side) portions of the coaxial wires 20a to 20f extending beyond the bundling unit 123. As an example, the cable 2 and the mold member 160 are included in a wire and mold-member assembly 13. The remaining configurations are the same as or similar to the configurations of the first embodiment.

The third embodiment brings about the same or similar advantages as those of the first embodiment. In the third embodiment, further, the front (i.e., F side) portions of the insulated wires 21a and 21b extending beyond the bundling unit 123 are not constrained by the mold member 160. At the time of soldering the conductors 27 to the power supply pad 133, thus, the positions of the insulated wires 21a and 21b are more readily adjustable. Namely, the third embodiment allows a further increased degree of freedom in the choice of positions of the insulated wires 21a and 21b inside the connector 100.

It may be noted that, in the connector 200, the back (i.e., B side) portions of the insulated wires 21a and 21b extending beyond the bundling unit 223 may be disposed outside the mold member 260. In this case, a degree of freedom is further increased in the choice of positions of the insulated wires 21a and 21b inside the connector 200.

The patterns of pads on the relay board 130 are not limited. In particular, a degree of freedom in choosing the pattern of pads connected to the insulated wires is high.

Figure 13A:
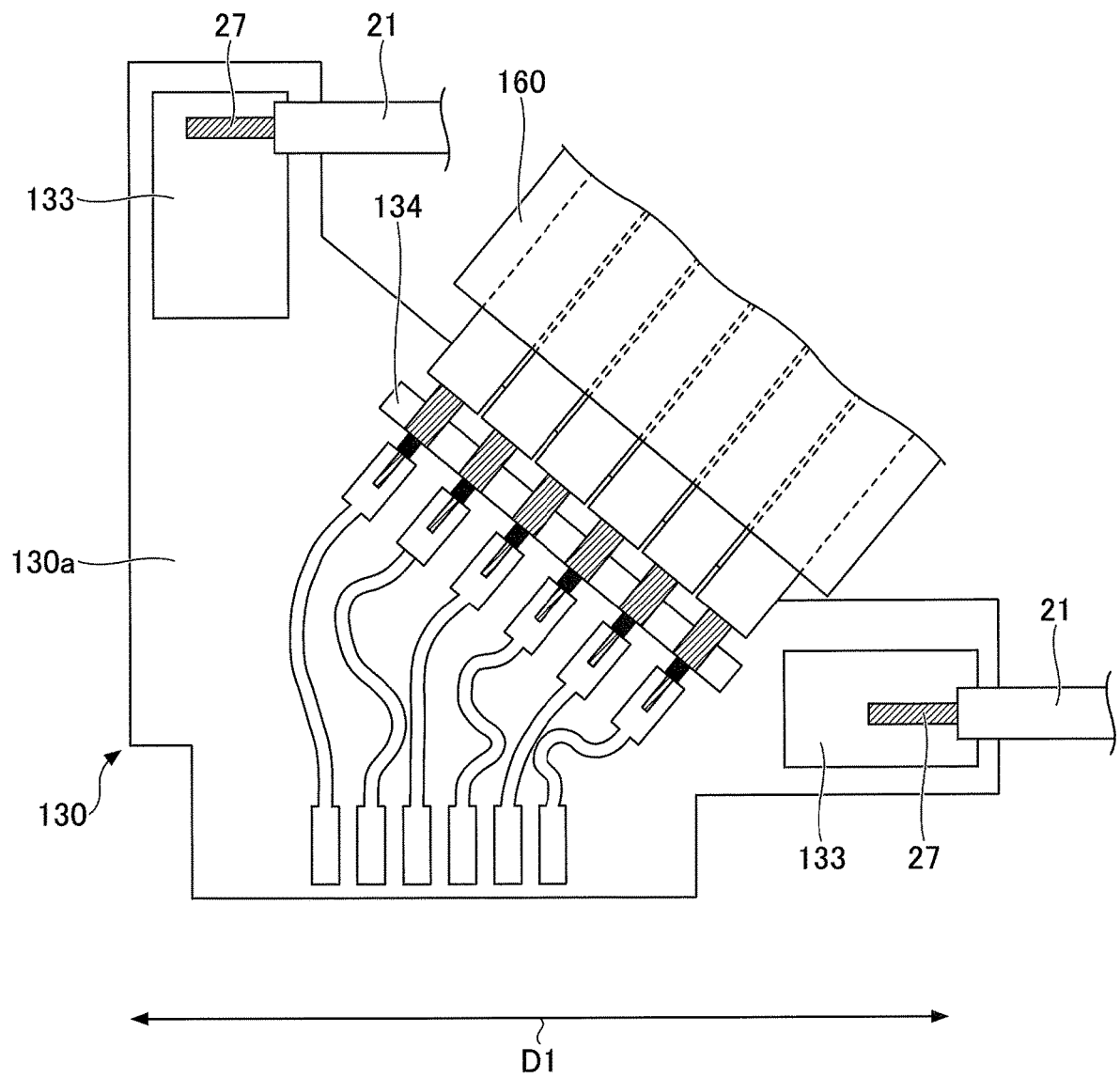
FIG. 13A is a drawing illustrating an example of the arrangement of power supply pads on the relay board.

For example, as illustrated in FIG. 13A, a power supply pad 133 may be disposed such that the conductor 27 of an insulated wire 21 is soldered thereto in the direction parallel to the direction indicated by the arrow D1 on the surface 130a of the relay board 130. Further, a plurality of power supply pads 133 may be disposed such that the ground pad 134 is placed therebetween.

Figure 13B:
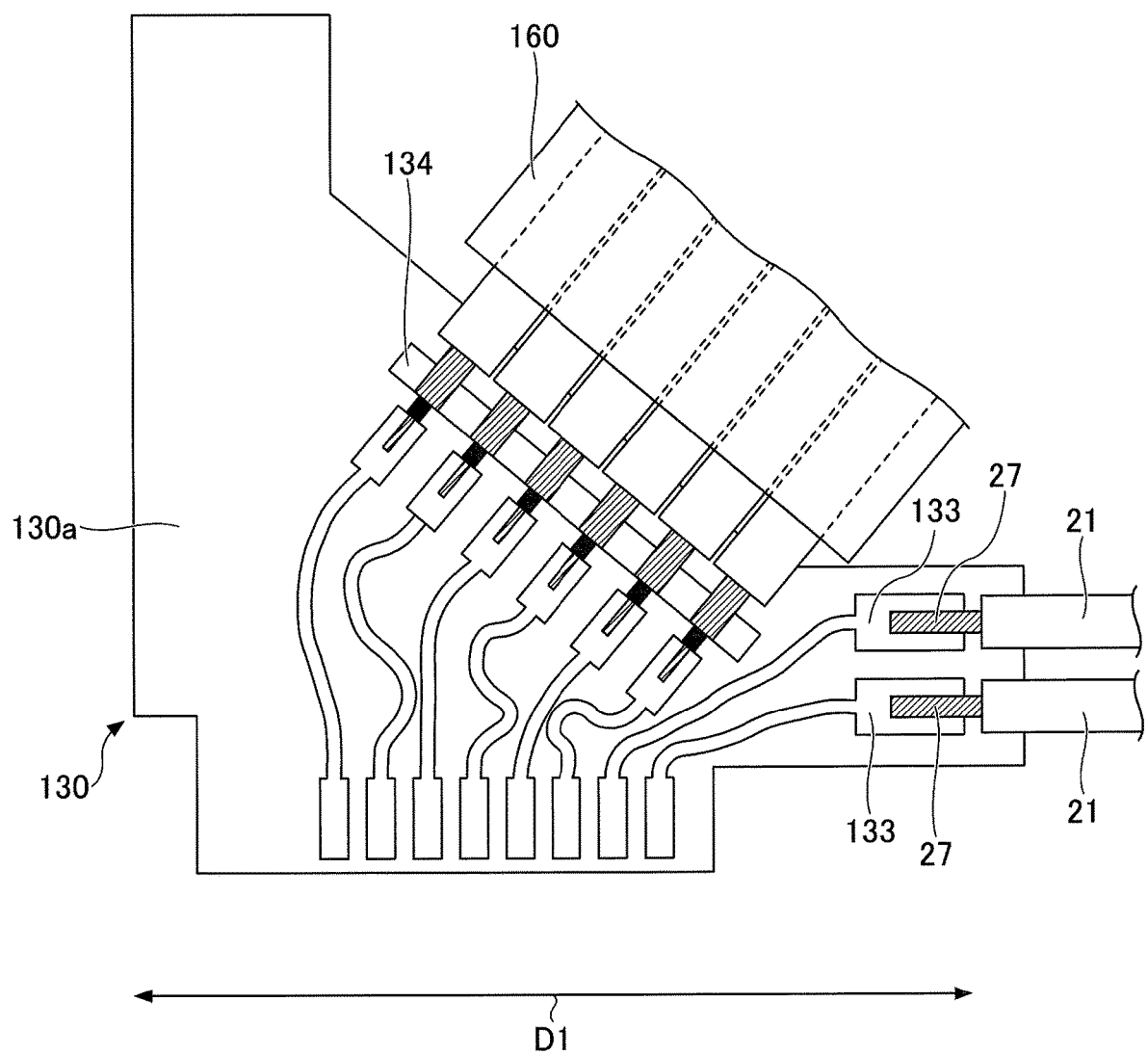
FIG. 13B is a drawing illustrating another example of the arrangement of power supply pads on the relay board.

As another example, as illustrated in FIG. 13B, a plurality of power supply pads 133, to which the conductors 27 of the insulated wires 21 are soldered in the direction parallel to the direction indicated by the arrow D1, may be arranged side by side in the direction perpendicular to the direction indicated by the arrow D1 on the surface 130a of the relay board 130.

Figure 13C:
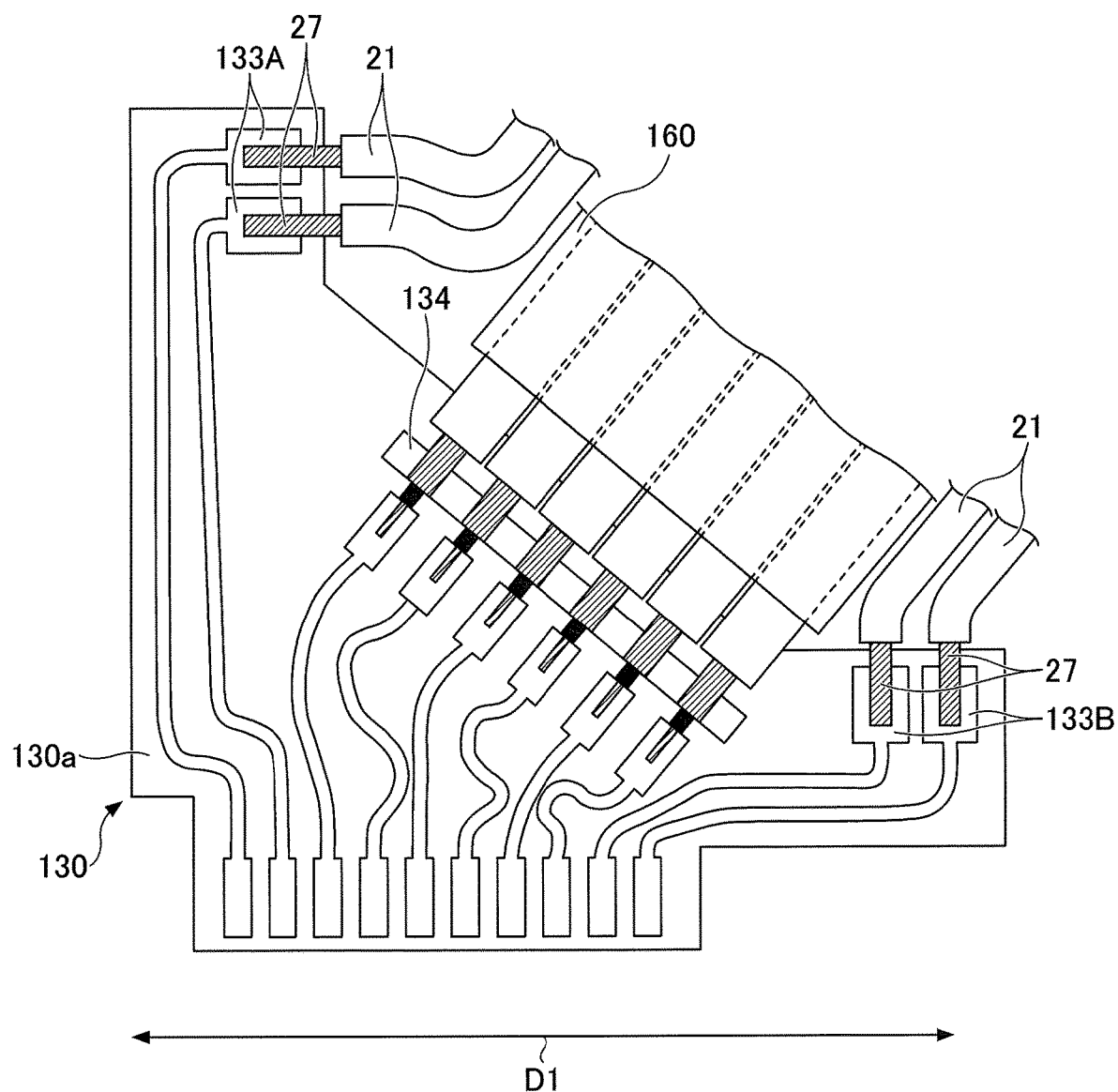
FIG. 13C is a drawing illustrating yet another example of the arrangement of power supply pads on the relay board.

As yet another example, as illustrated in FIG. 13C, power supply pads 133A and power supply pads 133B may be in a mixed arrangement on the surface 130a of the relay board 130, such that the conductors 27 of insulated wires 21 are soldered to the power supply pads 133A in the direction parallel to the direction indicated by the arrow D1, and the conductors 27 of insulated wires 21 are soldered to the power supply pads 133B in the direction perpendicular to the direction indicated by the arrow D1. In this example, the two power supply pads 133A are arranged side by side in the direction perpendicular to the direction indicated by the arrow D1, and the two power supply pads 133B are arranged side by side in parallel to the direction indicated by the arrow D1.

The same applies in the case of the relay board 230.

It should be noted that the pair of connectors included in the cable 1 with connectors is not limited to the combination of a right-angle connector and a straight connector. For example, as illustrated in FIG. 14A, both ends of the cable 2 may be connected to right-angle connectors 100. Alternatively, as illustrated in FIG. 14B, both ends of the cable 2 may be connected to straight connectors 200.

A component for preventing a temperature increase and a re-driver IC chip for signal correction may be provided in each of the two relay boards of the connector pair. Such configuration serves to reliably prevent a temperature increase in both connectors at the current transmitting side and at the current receiving side.

Although one or more embodiments have heretofore been described, any particular embodiments are non-limiting, and various variations and modifications may be made without departing from the scopes defined by the claims.

DESCRIPTION OF REFERENCE SYMBOLS

1: cable with connectors
2: cable
20a to 20f, 920: coaxial wire
21, 21a, 21b, 40, 41, 940: insulated wire
22: cable outer sheath
24: center conductor
25: insulator
26: outer conductor
27: conductor
100, 200: connector
123, 223: bundling unit
130, 230: relay board
130a, 230a: surface
130b, 230b: back surface
131a to 131f, 231a to 231f: wire pad
132a to 132f, 232a to 232f: connector pad
133, 133A, 133B, 233: power supply pad
134, 234: ground pad
135a to 135f, 235a to 235f: trace
150, 250: housing
151, 251: connection part
152, 252: connector terminal
160, 260: mold member
160A to 160D, 260A to 260D: face

The invention claimed is:

1. A wire and mold-member assembly, comprising:
a plurality of coaxial wires that are differential transmission wires;
a mold member situated at an end of the plurality of coaxial wires and configured to bundle the plurality of coaxial wires together; and
a relay board situated at the end of the plurality of coaxial wires,
wherein the mold member has a first face and a second face each intersecting with the plurality of coaxial wires,
wherein the second face is inclined at an angle greater than 0 degrees and less than 90 degrees relative to the first face, and
wherein the mold member is formed in direct contact with an outer surface of the coaxial wires to fix the coaxial wires in a state in which the coaxial wires are curved inside the mold member,
wherein the relay board includes:
a plurality of first pads aligned in a first direction and connected to the plurality of coaxial wires;
a plurality of second pads aligned in a second direction; and
arced lines connecting the plurality of first pads and the plurality of second pads, respectively,
wherein the second direction is inclined at an angle greater than 0 degrees and less than 90 degrees relative to the first direction.

2. The wire and mold-member assembly as claimed in claim 1, further comprising:
a cable outer sheath covering the plurality of differential transmission wires; and
an insulated wire covered with the cable outer sheath,
wherein the insulated wire intersects with the second face of the mold member.

3. The wire and mold-member assembly as claimed in claim 2, wherein a portion of the insulated wire closer to a tip thereof than a portion intersecting with the second face intersects with a third face different from the second face.

4. The wire and mold-member assembly as claimed in claim 1, further comprising:
a cable outer sheath covering the plurality of differential transmission wires; and
an insulated wire covered with the cable outer sheath,
wherein the insulated wire is disposed outside the mold member.

5. The wire and mold-member assembly as claimed in claim 1, wherein the second face is inclined at an angle greater than or equal to 30 degrees and less than or equal to 60 degrees relative to the first face.

6. The wire and mold-member assembly as claimed in claim 1, wherein the plurality of differential transmission wires are arranged in a single row or in two rows inside the mold member.

7. The wire and mold-member assembly as claimed in claim 1, wherein the second direction is inclined at an angle greater than or equal to 30 degrees and less than or equal to 60 degrees relative to the first direction.

8. The wire and mold-member assembly as claimed in claim 1, comprising an electronic component mounted on the relay board.

9. The wire and mold-member assembly as claimed in claim 8, wherein the relay board includes a re-driver IC chip for signal correction and a component for preventing a temperature increase, and
wherein the component for preventing a temperature increase is connected to the re-driver IC chip for signal correction between the first pads and the second pads.

10. The wire and mold-member assembly as claimed in claim 1, wherein each of the coaxial wires includes a center conductor, an insulator, and an outer conductor, and the center conductor is exposed at an end of each of the coaxial wires extending beyond the mold member.

11. The wire and mold-member assembly as claimed in claim 1, further comprising a cable outer sheath covering the coaxial wires, wherein the coaxial wires extend beyond an end of the cable outer sheath, and are not covered with the cable outer sheath between the mold member and the end of the cable outer sheath.

12. The wire and mold-member assembly as claimed in claim 1, further comprising insulated wires, and the coaxial wires and the insulated wires are arranged in two rows in the mold member.

13. A wire and mold-member assembly, comprising:
a plurality of coaxial wires that are differential transmission wires;
a mold member situated at an end of the plurality of coaxial wires and configured to bundle the plurality of coaxial wires together; and
a relay board situated at the end, wherein the mold member has a first face and a second face each intersecting with the plurality of coaxial wires, wherein the first face is situated closer to a tip of the end than the second face, wherein the second face is inclined at an angle greater than or equal to 30 degrees and less than or equal to 60 degrees relative to the first face, and wherein the relay board includes:

a plurality of first pads aligned in a first direction parallel to the first face and connected to the plurality of coaxial wires, a plurality of second pads aligned in a second direction perpendicular to the second face, arced lines connecting the plurality of first pads and the plurality of second pads, respectively, and wherein the mold member is formed in direct contact with an outer surface of the coaxial wires to fix the coaxial wires in a state in which the coaxial wires are curved inside the mold member.

14. A cable with a connector, comprising:
the wire and mold-member assembly as recited in claim 13;
a housing accommodating the relay board; and
a plurality of connector terminals disposed inside the housing and aligned in the second direction.

15. The wire and mold-member assembly as claimed in claim 13, wherein each of the coaxial wires includes a center conductor, an insulator, and an outer conductor, and the center conductor is exposed at an end of each of the coaxial wires extending beyond the mold member.

16. The wire and mold-member assembly as claimed in claim 13, further comprising a cable outer sheath covering the coaxial wires, wherein the coaxial wires extend beyond an end of the cable outer sheath, and are not covered with the cable outer sheath between the mold member and the end of the cable outer sheath.

17. The wire and mold-member assembly as claimed in claim 13, further comprising insulated wires, and the coaxial wires and the insulated wires are arranged in two rows in the mold member.

* * * * *